United States Patent
Sohn et al.

(10) Patent No.: US 8,495,437 B2
(45) Date of Patent: Jul. 23, 2013

(54) SEMICONDUCTOR MEMORY DEVICE

(75) Inventors: Kyo-min Sohn, Gyeonggi-do (KR); Byung-sik Moon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/602,906

(22) Filed: Sep. 4, 2012

(65) Prior Publication Data

US 2013/0061102 A1    Mar. 7, 2013

Related U.S. Application Data

(60) Provisional application No. 61/531,201, filed on Sep. 6, 2011.

(30) Foreign Application Priority Data

Apr. 25, 2012 (KR) .......... 10-2012-0043478

(51) Int. Cl.
*G11C 29/00* (2006.01)

(52) U.S. Cl.
USPC .......... 714/718; 714/763

(58) Field of Classification Search
USPC .......... 341/55; 375/257; 711/154; 714/809, 714/764, 774, 718, 763
See application file for complete search history.

(56) References Cited

U.S. PATENT DOCUMENTS

| | | | |
|---|---|---|---|
| 6,584,526 B1 | 6/2003 | Bogin et al. | |
| 7,501,963 B1 * | 3/2009 | Hollis | 341/55 |
| 7,701,368 B2 * | 4/2010 | Hollis | 341/55 |
| 7,869,525 B2 * | 1/2011 | Macri et al. | 375/257 |
| 8,069,403 B2 * | 11/2011 | Bisen et al. | 714/809 |
| 8,364,913 B2 * | 1/2013 | Kwak | 711/154 |
| 2005/0289435 A1 | 12/2005 | Mulla et al. | |

FOREIGN PATENT DOCUMENTS

| KR | 20090006642 U | 7/2009 |
|---|---|---|
| KR | 20110072279 A | 6/2011 |

* cited by examiner

*Primary Examiner* — David Ton
(74) *Attorney, Agent, or Firm* — Harness, Dickey & Pierce, P.L.C.

(57) ABSTRACT

A semiconductor memory device including a data bus inversion (DBI) determination unit, a first inverter, a cyclic redundancy check (CRC) calculation unit, a second inverter, and a DQ pin. The DBI determination unit is configured to determine whether to perform DBI based on first data on a main data line and configured to generate DBI data. The first inverter is configured to invert or non-invert the first data according to the DBI data to generate second data. The CRC calculation unit is configured to generate CRC data based on the second data and the DBI data. The second inverter is configured to invert or non-invert the first data according to the DBI data to generate third data. The DQ pin is configured to output the third data externally.

20 Claims, 16 Drawing Sheets

FIG. 5

| BURST<br>PIN | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | 1 |
| DQ1 | d8 | d9 | d10 | d11 | d12 | d8 | d14 | d15 | CRC1 | 1 |
| DQ2 | d16 | d17 | d18 | d19 | d20 | d16 | d22 | d23 | CRC2 | 1 |
| DQ3 | d24 | d25 | d26 | d27 | d28 | d24 | d30 | d31 | CRC3 | 1 |
| DQ4 | d32 | d23 | d34 | d35 | d36 | d32 | d38 | d39 | CRC4 | 1 |
| DQ5 | d40 | d41 | d42 | d43 | d44 | d40 | d46 | d47 | CRC5 | 1 |
| DQ6 | d48 | d49 | d50 | d51 | d52 | d48 | d54 | d55 | CRC6 | 1 |
| DQ7 | d56 | d57 | d58 | d59 | d60 | d56 | d62 | d63 | CRC7 | 1 |
| DBI | d64 | d65 | d66 | d67 | d68 | d64 | d70 | d71 | 1 | 1 |

FIG. 6

| PIN\BURST | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | 1 |
| DQ1 | d8 | d9 | d10 | d11 | d12 | d8 | d14 | d15 | CRC1 | 1 |
| DQ2 | d16 | d17 | d18 | d19 | d20 | d16 | d22 | d23 | CRC2 | 1 |
| DQ3 | d24 | d25 | d26 | d27 | d28 | d24 | d30 | d31 | CRC3 | 1 |
| DQ4 | d32 | d23 | d34 | d35 | d36 | d32 | d38 | d39 | CRC4 | 1 |
| DQ5 | d40 | d41 | d42 | d43 | d44 | d40 | d46 | d47 | CRC5 | 1 |
| DQ6 | d48 | d49 | d50 | d51 | d52 | d48 | d54 | d55 | CRC6 | 1 |
| DQ7 | d56 | d57 | d58 | d59 | d60 | d56 | d62 | d63 | CRC7 | 1 |
| LDBI | d64 | d65 | d66 | d67 | d68 | d64 | d70 | d71 | 1 | 1 |
| DQ8 | d72 | d73 | d74 | d75 | d76 | d77 | d78 | d79 | CRC8 | 1 |
| DQ9 | d80 | d81 | d82 | d83 | d84 | d85 | d86 | d87 | CRC9 | 1 |
| DQ10 | d88 | d89 | d90 | d91 | d92 | d93 | d94 | d95 | CRC10 | 1 |
| DQ11 | d96 | d97 | d98 | d99 | d100 | d101 | d102 | d103 | CRC11 | 1 |
| DQ12 | d104 | d105 | d106 | d107 | d108 | d109 | d110 | d111 | CRC12 | 1 |
| DQ13 | d112 | d113 | d114 | d115 | d116 | d117 | d118 | d119 | CRC13 | 1 |
| DQ14 | d120 | d121 | d122 | d123 | d124 | d125 | d126 | d127 | CRC14 | 1 |
| DQ15 | d128 | d129 | d130 | d131 | d132 | d133 | d134 | d135 | CRC15 | 1 |
| UDBI | d136 | d137 | d138 | d139 | d140 | d141 | d142 | d143 | 1 | 1 |

FIG. 7

| BURST<br>PIN | 0 | 1 | 2 | 3 | 4 | 5 | 6 | 7 |
|---|---|---|---|---|---|---|---|---|
| DQ0 | d0 | d1 | d2 | d3 | d4 | d5 | d6 | d7 |
| DQ1 | d8 | d9 | d10 | d11 | d12 | d8 | d14 | d15 |
| DQ2 | d16 | d17 | d18 | d19 | d20 | d16 | d22 | d23 |
| DQ3 | d24 | d25 | d26 | d27 | d28 | d24 | d30 | d31 |
| DQ4 | d32 | d23 | d34 | d35 | d36 | d32 | d38 | d39 |
| DQ5 | d40 | d41 | d42 | d43 | d44 | d40 | d46 | d47 |
| DQ6 | d48 | d49 | d50 | d51 | d52 | d48 | d54 | d55 |
| DQ7 | d56 | d57 | d58 | d59 | d60 | d56 | d62 | d63 |
| DBI | d64 | d65 | d66 | d67 | d68 | d64 | d70 | d71 |
| EDC | CRC0 | CRC1 | CRC2 | CRC3 | CRC4 | CRC5 | CRC6 | CRC7 |

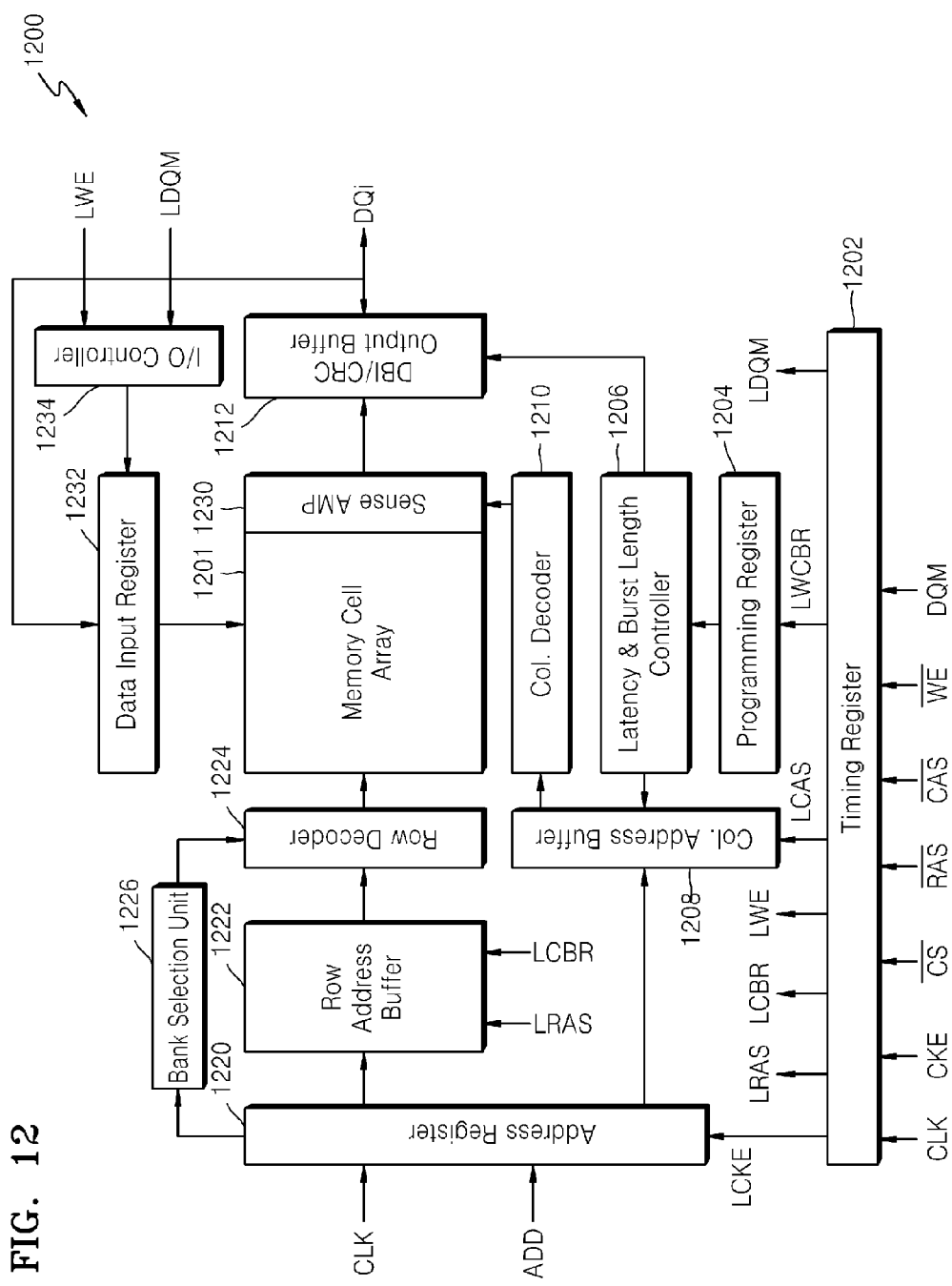

SEMICONDUCTOR MEMORY DEVICE

CROSS-REFERENCE TO RELATED APPLICATIONS

This application claims the benefit of U.S. Provisional Application No. 61/531,201, filed on Sep. 6, 2011, in the United States Patent and Trademark Office (USPTO), and Korean Patent Application No. 10-2012-0043478, filed on Apr. 25, 2012, in the Korean Intellectual Property Office, the disclosures of which are incorporated herein in their entirety by reference.

BACKGROUND

Example embodiments of the inventive concepts relate to a semiconductor memory device, and more particularly, to a semiconductor memory device with both a data bus inversion (DBI) function and a cyclic redundancy check (CRC) function.

Data bus inversion (DBI) is a technique for current reduction in which, to reduce consumption of a large amount of current in transmission lines terminated with a power voltage Vdd while transmitting a low-level signal, as compared with a high-level signal, if data includes a larger number of low-level bits than high-level bits, the data is converted to include half or less low-level bits of a total bits number, with additional transmission of a signal indicating the data conversion, thereby reducing current consumption. Cyclic redundancy check (CRC) is a technique for reducing data loss during transmission between a memory and a controller, in which CRC data obtained through a CRC calculation is also transmitted to enable error detection. Simultaneously activating a DBI function and a CRC function may lead to a complicated main data line structure.

SUMMARY

Example embodiments of the inventive concepts provide a semiconductor memory device that simultaneously supports a data bus inversion (DBI) function and a cyclic redundancy check (CRC) function with a simple main data line structure.

In one example embodiment, the semiconductor memory device includes a data bus inversion (DBI) determination unit, a first inverter, a cyclic redundancy check (CRC) calculation unit, a second inverter, and a DQ pin. The DBI determination unit is configured to determine whether to perform DBI based on first data on a main data line and configured to generate DBI data. The first inverter is configured to invert or non-invert the first data according to the DBI data to generate second data. The CRC calculation unit is configured to generate CRC data based on the second data and the DBI data. The second inverter is configured to invert or non-invert the first data according the DBI data to generate third data. The DQ pin externally outputs the third data.

In some example embodiments the second inverter may be configured to directly receive the first data from the main data line.

In some example embodiments the CRC data may be output after the third data via the DQ pin.

In some example embodiments the semiconductor memory device may further include an output register configured to receive the third data from the second inversion unit and the CRC data from the CRC calculation unit, and configured to sequentially provide the third data and the CRC data to the DQ pin.

In some example embodiments the semiconductor memory device may further include an error detection code (EDC) pin configured to externally output the CRC data.

In some example embodiments the semiconductor memory device may further include a DBI pin configured to output the DBI data externally.

In some example embodiments the first inverter may be adjacent to the CRC calculation unit, and the second inverter may be adjacent to the DQ pin.

In some example embodiments the first inverter and the CRC calculation unit may be deactivated if a CRC function is turned off, and the first inversion unit and the second inversion unit may invert the first data if a DBI function is turned off.

In another example embodiment, the semiconductor memory device includes n number of DQ pins and a burst length of m, wherein m and n are natural numbers. The semiconductor memory device includes a main data line, a DBI determination unit, a CRC inverter, a CRC calculation unit, an output inverter, and 1st to nth registers. The main data line is configured to transmit first data including 1st to (m×n)th data bits, the 1st to (m×n)th data bits including 1st to mth data column sets or 1st to nth data row sets, each data column set being of n data bits, and each data row set being of m data bits. The DBI determination unit is configured to determine whether to perform DBI on each of the 1st to mth data column sets to generate 1st to mth DBI bits. The CRC is configured to invert or non-invert the 1st to mth data column sets based on the 1st to mth DBI bits to generate second data. The CRC calculation unit is configured to generate 1st to nth CRC bits from the second data and the 1st to mth DBI bits. The output inverter is configured to invert or non-invert m data bits in each of the 1st to nth data row sets of 1st to (m×n)th data bits based on the 1st to mth DBI bits to generate third data. The 1st to nth registers are configured to provide the third data corresponding to the 1st to nth data row sets and the 1st to nth CRC bits to 1st to nth DQ pins, respectively.

In some example embodiments the DBI determination unit may include 1st to mth DBI determination units and a kth DBI determination unit (where $1 \leq k \leq m$) may be configured to determine whether to perform DBI on n number of data bits of a kth data column set.

In some example embodiments the CRC inverter may include 1st to mth CRC inverter units, and a kth CRC inverter unit (where $1 \leq k \leq m$) may be configured to invert or non-invert n number of data bits of a kth data column set to generate some of the second data that corresponds to the kth data column set.

In some example embodiments the output inverter may include 1st to nth output inverter units, wherein a kth output inverter unit (where $1 \leq k \leq n$) may be configured to invert or non-invert m number of data bits of a kth data row set based on the corresponding 1st to mth DBI bits to generate some of the third data that corresponds to the kth data row set.

In some example embodiments the kth data column set (where $1 \leq k \leq m$) among the 1st to mth data column sets may include kth, (n+k)th, (2n+k)th, (3n+k)th, . . . , and ((m−1)n+k)th data bits.

In some example embodiments the kth data row set (where $1 \leq k \leq n$) among the 1st to nth data row sets may include ((k−1)n+1)th, ((k−1)n+2)th, ((k−1)n+3)th, ((k−1)n+4)th, . . . , and (k×n)th data bits.

In some example embodiments a kth register (where $1 \leq k \leq n$) may sequentially provide ((k−1)n+1)th, ((k−1)n+2)th, ((k−1)n+3)th, ((k−1)n+4)th, . . . , and (k×n)th data bits of the third data, and the kth CRC bit to a kth DQ pin.

In some example embodiments the semiconductor memory device may further include a DBI register configured to sequentially provide the $1^{st}$ to $m^{th}$ DBI bits to the DBI pin.

In another example embodiment, the semiconductor memory device includes a main data line, a first circuit configured to invert or non-invert first data received from the main data line according to a ratio of logic low data to logic high data in order to generate second data, and configured to generate cyclic redundancy check (CRC) data based on the second data and the ratio of logic low data to logic high data, and a second circuit electrically connected in parallel with the first circuit to the main data line, the second circuit configured to invert or non-invert the first data received from the main data line based on the ratio of logic low data to logic high data in order to generate third data.

In some example embodiments, the the first circuit may include a data bus inversion (DBI) determination unit configured to determine the ratio of logic low data to logic high data, and the second circuit may receive the ratio of logic low data to logic high data from the DBI determination unit.

In some example embodiments, the DBI determination unit may be configured to determine whether to perform DBI based on the ratio of logic low data to logic high data.

In some example embodiments, the semiconductor memory device may be configured to output the third data externally via a DQ pin.

In some example embodiments, the semiconductor memory device may include an output register configured to receive the third data from the second circuit and the CRC data from the first circuit, and configured to sequentially provide the third data and the CRC data to the DQ pin.

BRIEF DESCRIPTION OF THE DRAWINGS

Example embodiments of the inventive concepts will be more clearly understood from the following detailed description taken in conjunction with the accompanying drawings in which:

FIG. 5 is a cyclic redundancy check (CRC) data bit mapping table in a semiconductor memory device (X8) according to an example embodiment of the inventive concepts;

FIG. 6 is a CRC data bit mapping table in a semiconductor memory device (X16) according to an example embodiment of the inventive concepts;

FIG. 7 is a CRC data bit mapping table in a semiconductor memory device (X8) according to an example embodiment of the inventive concepts;

FIG. 12 is a block diagram of a semiconductor memory device according to an example embodiment of the inventive concepts;

DETAILED DESCRIPTION OF EXAMPLE EMBODIMENTS

Figure 1:
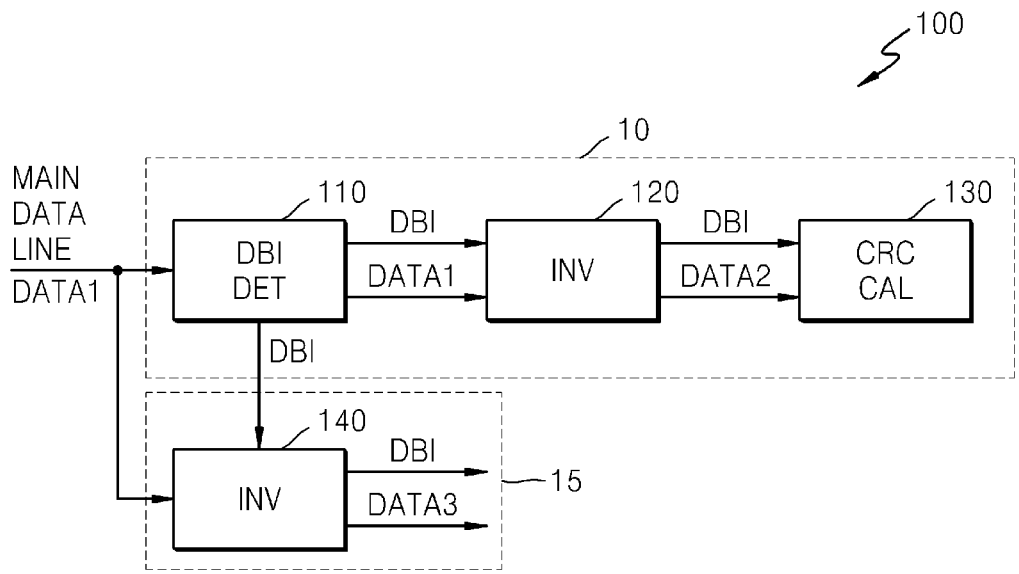
FIG. 1 is a schematic block diagram of a semiconductor memory device according to an example embodiment of the inventive concepts.

Example embodiments of the inventive concepts will now be described more fully with reference to the accompanying drawings, in which some example embodiments are shown. The invention may, however, be embodied in many different forms and should not be construed as being limited to the example embodiments set forth herein; rather, these example embodiments are provided so that this disclosure will be thorough and complete, and will fully convey the concepts of the invention to those skilled in the art. However, this is not intended to limit example embodiments to particular modes of practice, and it is to be appreciated that all changes, equivalents, and substitutes that do not depart from the spirit and technical scope of the present invention are encompassed in the present invention.

Like numbers refer to like elements throughout. In the drawings, the dimensions of structures are exaggerated or reduced for clarity.

The terminology used herein is for the purpose of describing particular example embodiments only and is not intended to be limiting. As used herein, the singular forms "a", "an" and "the" are intended to include the plural forms as well, unless the context clearly indicates otherwise. It will be further understood that the terms "includes," "including," "comprises" and/or "comprising," when used in this specification, specify the presence of stated features, but do not preclude the presence or addition of one or more other features. As used herein, the term "and/or" includes any and all combinations of one or more of the associated listed items. It will be understood that although the terms "first", "second" or the like are used herein to describe various elements, these elements should not be limited by these terms. The above terms are used only to distinguish one element from another. Thus, a first element discussed below could be termed a second element, and similarly, a second element may be termed a first element without departing from the teachings of this disclosure. It will be understood that when a first element is referred to as being connected to, linked to or contacting a second element, an intervening third element may be present between the first and second elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a semiconductor memory device 100 according to an example embodiment of the inventive concepts. Referring to FIG. 1, the semiconductor memory device 100 includes a data bus inversion (DBI) determination unit 110, a first inverter 120, a cyclic redundancy check (CRC) calculation unit 130, and a second inverter 140. As shown in FIG. 1, a first circuit 10 may include the DBI determination unit 110, the first inverter 120 and the CRC calculation unit 130 while a second circuit 15 may include the second inverter 140. While not illustrated in the other drawings, the other drawings can be similarly revised to show the first circuit 10 and the second circuit 15.

The semiconductor memory device 100 may include a memory cell array (not shown) for storing data. The memory cell array may include a plurality of word lines (not shown) extending in a row direction, a plurality of bit lines (not shown) extending in a column direction, and a plurality of memory cells arranged at intersections of the word lines and the bit lines. In order to access a memory cell of the memory cell array according to an address, the semiconductor memory device 100 may include a row decoder (not shown) for selecting a word line connected to the memory cell, and a column decoder (not shown) for selecting a bit line connected to the memory cell. Data stored in the memory cell accessed according to the address may be externally output via the bit line, a local input/output line (not shown) connected to the bit line, a global input/output line (not shown) connected to the local input/output line, and a main data line MAIN DATA LINE connected to the global input/output line.

As used herein, data stored in the memory cell array is referred to as first data DATA1, which is provided via the main data line MAIN DATA LINE to the DBI determination unit 110 and a second inverter 140.

The DBI determination unit 110 receives the first data DATA1, determines whether to perform DBI based on the first data DATA1, and generates DBI data DBI.

As described above, DBI is technique used to reduce current flow in transmission lines, and may be applied to a semiconductor memory device having a plurality of DQ pins. For example, if a transmission line is terminated with a power voltage Vdd, a relatively large amount of current consumption occurs in transmitting a low level signal compared to a high level signal. Thus, if data to be transmitted through the plurality of DQ pins includes a larger number of low-level bits than high-level bits, the data may be converted to have low-level bits that are half or less a total bits number of the data, and a signal indicating the data inversion may further be transmitted. Namely, inversion is based on a ratio of logic low data to logic high data.

For example, if a semiconductor memory device includes eight DQ pins, data may be transmitted 8 bits at a time. If there are five or more low-level bits among the 8 bits, a DBI function block may invert the data and provide a DBI bit indicating the data inversion. The DBI bit indicating the data inversion may be defined to have a low level. If there are four or less low-level bits among the eight bits, the DBI function block may not invert the data and provide a high level DBI bit indicating the data inversion. As a result, the 8 bits and the DBI bit may include in total four or less low-level bits.

Throughout the specification, the transmission line is assumed to be terminated with a power voltage (Vdd). Thus, if data includes more low-level bits than high-level bits, inversion of the data may be advantageous in terms of power consumption. It is further assumed that a Low level DBI bit indicates the data conversion. However, example embodiments of the inventive concepts are not limited thereto.

The DBI determination unit 110 may compare the number of low-level bits and high-level bits in first data DATA1. If the number of low-level bits is greater than the number of high-level bits, the DBI determination unit 110 may generate DBI data DBI for inversion of the first data DATA1. As described above, if the DBI data DBI has a high level, inversion of the first data DATA1 is unnecessary. Otherwise, if the DBI data DBI has a low level, the first data DATA1 may be inverted by the first and second inverters 120 and 140.

The first inverter 120 may receive the DBI data DBI from the DBI determination unit 110. The first inverter 120 may receive the first data DATA1 from the DBI determination unit 110 or may receive the first data DATA1 through the main data line MAIN DATA LINE, according to a circuit design. The first inverter 120 may invert or non-invert the first data DATA1 according to the DBI data DBI to generate second data DATA2. As described above, if the DBI data DBI has a low level, the second data DATA2 may be data inverted from the first data DATA1. If the DBI data DBI has a high level, the second data DATA2 may be the same as the first data DATA1.

The CRC calculation unit 130 may receive the second data DATA2 from the first inverter 120. The CRC calculation unit 130 may receive the DBI data DBI from the DBI determination unit 110 or may receive the DBI data DBI via the first inverter 120, according to a circuit design. The CRC calculation unit 130 may perform CRC calculation on the second data DATA2 and the DBI data DBI to generate CRC data CRC. The CRC calculation unit 130 may use CRC-8 with a 9-bit polynomial length, i.e., $x8+x2+x+1$. In some other example embodiments another CRC polynomial may be used.

The second inverter 140 may receive DBI data DBI from the DBI determination unit 110, and may directly receive the first data DATA1 through the main data line MAIN DATA LINE. The second inverter 140 may invert or non-invert the first data DATA1 according to the DBI data DBI to generate third data DATA3. As described above, if the DBI data DBI has a low level, the third data DATA3 may be data inverted from the first data DATA1. If the DBI data DBI has a high level, the third data DATA3 may be the same as the first data DATA1, i.e., not inverted therefrom.

The first and second inverters 120 and 140 are functionally the same in that they invert or non-invert the first data DATA1 based on the DBI data DBI. The second data DATA2 generated by the first inverter 120 and the third data DATA3 generated by the second inverter 140 are the same, except that the second data DATA2 is provided to the CRC calculation unit 130 for CRC calculation, and the third data DATA3 is provided to the DQ pins for external output.

If the second data DATA2 is used in CRC calculation and in data output, an extra number of data lines, which is as many as the bits number of the second data DATA2, is required between the first inverter 120 or the CRC calculation unit 130, and the DQ pins. For example, if the number of main data lines for transmitting the first data DATA1 is 64, 64 data lines are required for transmission of the second data DATA2. The extra 64 data lines arranged between the DBI determination unit 110, the first inverter 120, or the CRC calculation unit 130, and the DQ pins may reduce space use.

However, in the present example embodiment, the second inverter 140 that is arranged near the DQ pins is used to generate the third data DATA3, so that data lines for transmitting the second data DATA2 to the DQ pins are unnecessary. Instead, data lines for providing the DBI data DBI from the DBI determination unit 110 to the second inverter 140 are enough. As a result, manufacturing costs may be reduced with an increased efficiency in area use.

In the semiconductor memory device 100, the CRC function and the DBI function may be independently enabled or disabled according to a mode register set (MRS). In the block diagram of FIG. 1, both the CRC function and DBI function are enabled. If the CRC function is disabled according to the MRS, the first inverter 120 and the calculation unit 130 may be deactivated. If the DBI function is disabled, the first and second inverters 120 and 140 may non-invert the first data DATA1 to generate the second and third data DATA2 and DATA3 that are the same as the first data DATA1. Thus, if one or both of the CRC function and the DBI function are enabled, example embodiments of the inventive concepts may be readily applied without a complicated change in design.

Figure 2:
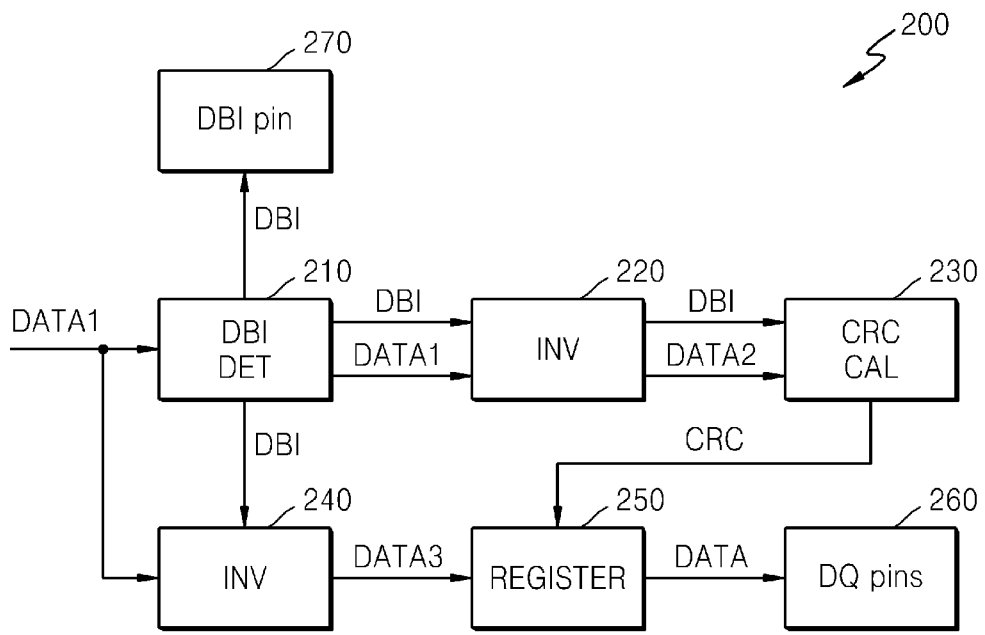
FIG. 2 is a schematic block diagram of a semiconductor memory device according to another example embodiment of the inventive concepts.

FIG. 2 is a schematic block diagram of a semiconductor memory device 200 according to another example embodiment of the inventive concepts. Referring to FIG. 2, the semiconductor memory device 200 includes a DBI determination unit 210, a first inverter 220, a CRC calculation unit 230, and a second inverter 240. The semiconductor memory device 200 may further include an output register 250, DQ pins 260, and a DBI pin 270. The DBI determination unit 210, the first inverter 220, the CRC calculation unit 230, and the second inverter 240 are substantially the same as the DBI determination unit 110, the first inverter 120, the CRC calculation unit 130, and the second inverter 140 of the semiconductor memory device 100 described with reference to FIG. 1, respectively, and thus, are described only briefly below.

The first data DATA1 stored in the memory cell array may be provided to the DBI determination unit 210 and the second inverter 240 through the main data line. The DBI determination unit 210 receives the first data DATA1, determines whether to perform DBI based on the first data DATA1, and generates DBI data DBI.

The first inverter 220 may receive the DBI data DBI from the DBI determination unit 210, and may receive the first data DATA1 from the DBI determination unit 210 or receive the first data DATA1 through the main data line MAIN DATA LINE. The first inverter 220 may invert or non-invert the first data DATA1 according to the DBI data DBI to generate second data DATA2.

The CRC calculation unit 230 may receive the second data DATA2 from the first inverter 220, and may receive DBI data DBI from the DBI determination unit 210 or receive the DBI data DBI through the first inverter 220. The CRC calculation unit 230 may perform CRC calculation on the second data DATA2 and the DBI data DBI to generate CRC data CRC.

The second inverter 240 may receive DBI data DBI from the DBI determination unit 210, and may directly receive the first data DATA1 through the main data line MAIN DATA LINE. The second inverter 240 may invert or non-invert the first data DATA1 according to the DBI data DBI to generate third data DATA3.

The output register 250 may receive the third data DATA3 from the second inverter 240, and may receive the CRC data CRC from the CRC calculation unit 230. The output register 250 may provide the third data DATA3 and the CRC data CRC to the DQ pins 260 as data DATA. The DQ pins 260 may sequentially output the third data DATA3 and the CRC data CRC. Therefore, the CRC data CRC may be output only after the third data DATA3 is all output through the DQ pins 260.

The DBI data DBI generated by the DBI determination unit 210 may be output through the DBI pin 270. The DBI data DBI may be output through an additional DBI register (not shown) before being output through the DBI pin 270. In some example embodiments, the DBI data DBI may be temporarily stored in the output register 250 and then output through the DBI pin 270.

The first inverter 220 may be arranged adjacent to the CRC calculation unit 230, and the second inverter 240 may be arranged adjacent to the DQ pins 260. As described above, the arrangement of the second inverter 240 for generating the third data DATA3 to be externally output between the main data line MAIN DATA LINE and the DQ pins 260 may eliminate a need to transmit the second data DATA2 generated by the first inverter 220 to the DQ pins 260.

Figure 3:
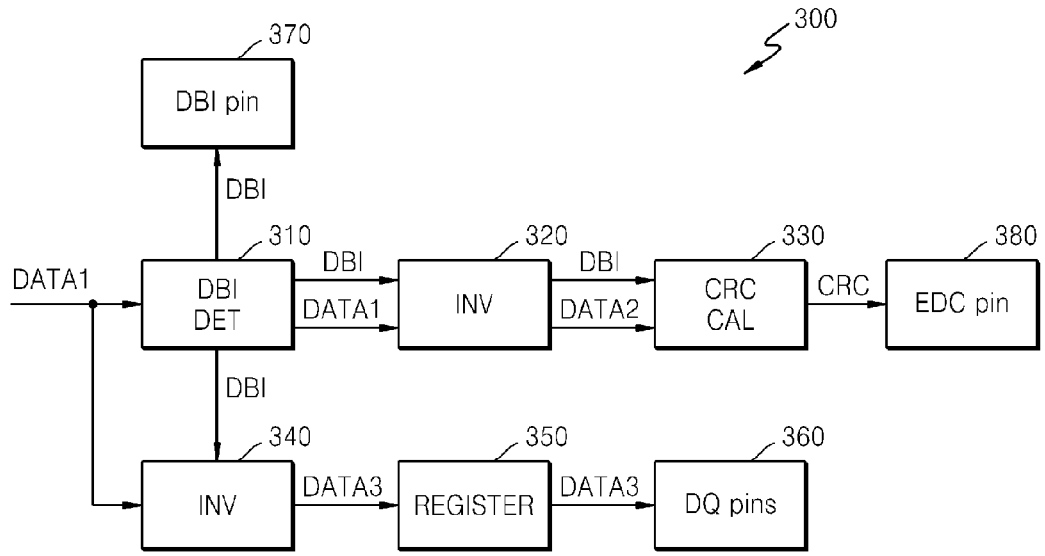
FIG. 3 is a schematic block diagram of a semiconductor memory device according to another example embodiment of the inventive concepts.

FIG. 3 is a schematic block diagram of a semiconductor memory device 300 according to another example embodiment of the inventive concepts. Referring to FIG. 3, the semiconductor memory device 300 includes a DBI determination unit 310, a first inverter 320, a CRC calculation unit 330, and a second inverter 340. The semiconductor memory device 300 may further include an output register 350, DQ pins 360, and an error detection code (EDC) pin 380. The DBI determination unit 310, the first inverter 320, the CRC calculation unit 330, and the second inverter 340 are substantially the same as the DBI determination unit 110, the first inverter 120, the CRC calculation unit 130, and the second inverter 140 of the semiconductor memory device 100 described with reference to FIG. 1, respectively, and thus, are described only briefly below.

The DBI determination unit 310 receives the first data DATA1 through a main data line, determines whether to perform DBI based on the first data DATA1, and generates DBI data DBI. The first inverter 320 may receive the DBI data DBI and the first data DATA1 from the DBI determination unit 310. The first inverter 320 may invert or non-invert the first data DATA1 according to the DBI data DBI to generate second data DATA2. The CRC calculation unit 330 may receive the second data DATA2 and the DBI data DBI from the first inverter 320. The CRC calculation unit 330 may perform CRC calculation on the second data DATA2 and the DBI data DBI to generate CRC data CRC.

The second inverter 340 may receive DBI data DBI from the DBI determination unit 310, and may directly receive the first data DATA1 through the main data line MAIN DATA LINE. The second inverter 340 may invert or non-invert the first data DATA1 according to the DBI data DBI to generate third data DATA3. The output register 350 may receive the third data DATA3 from the second inverter 340. The output register 350 may provide the third data DATA3 to the DQ pins 260, which may output the third data DATA3.

The DBI data DBI generated by the DBI determination unit 310 may be output through the DBI pin 370. The DBI data DBI may be temporarily stored in an additional DBI register (not shown) before being output through the DBI pin 370. The CRC data CRC generated by the CRC calculation unit 330 may be output through the EDC pin 380. The CRC data CRC may be temporarily stored in an additional CRC register (not shown) before being output through the EDC pin 380.

Figure 4:
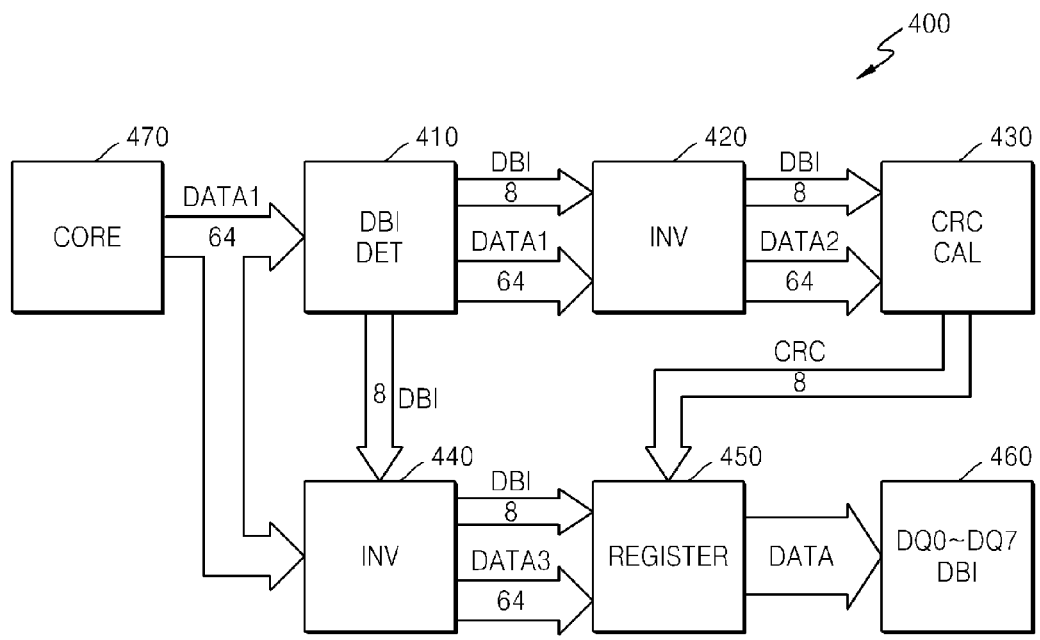
FIG. 4 is a schematic block diagram of a semiconductor memory device according to another example embodiment of the inventive concepts.

FIG. 4 is a schematic block diagram of a semiconductor memory device 400 according to another example embodiment of the inventive concepts. Referring to FIG. 4, the semiconductor memory device 400 includes a DBI determination unit 410, a first inverter 420, a CRC calculation unit 430, a second inverter 440, and a memory core 470. The semiconductor memory device 400 may further include an output register 450 and data output pins 460. The DBI determination unit 410, the first inverter 420, the CRC calculation unit 430, and the second inverter 440 are substantially the same as the DBI determination unit 110, the first inverter 120, the CRC calculation unit 130, and the second inverter 140 of the semiconductor memory device 100 described with reference to FIG. 1, respectively, and thus, are described only briefly below.

FIG. 4 is a block diagram of the semiconductor memory device 400 illustrating data flow. It is assumed that the semiconductor memory device 400 includes eight DQ pins and has a burst length of 8. For example, the semiconductor memory device 400 is assumed to output 64-bit data in response to one read command. Eight bits of the 64-bit data are output through the 8 DQ pins at a first burst, eight bits are output through the 8 DQ pins at a second burst, and eight bits are output through the 8 DQ pins at a third burst. For example, the data are output by 8 bits for each of the first to eighth bursts.

The memory core 470 may include a memory cell array (not shown) for storing data. A size of the first data DATA1 to be output in response to one read command may be 64 bits, and the first data DATA1 may be stored in the memory core 470. The first data DATA 1 may be output through the main data line. The main data line may include 64 data lines to transmit the 64-bit first data DATA1. The 64-bit first data DATA1 may be provided to the DBI determination unit 410 and the second inverter 440 through the 64 data lines.

The DBI determination unit 410 receives the first data DATA1, determines whether to perform DBI based on the first data DATA1, and generates DBI data DBI. The DBI determination unit 410 may determine whether to perform DBI on 8 bits of the 64-bit first data DATA1 output for the first burst, and generate corresponding 1-bit DBI data DBI. The DBI determination unit 410 may determine whether to perform DBI on 8 bits of the 64-bit first data DATA1 output for the second burst, and generate corresponding 1-bit DBI data DBI. DBI data DBI of 8 bits in total corresponding to the data output for the first to eighth bursts, respectively, may be generated. Eight bits of the first data DATA1 output through the 8 DQ pins for a kth burst will be referred to as kth burst data in the following description. One-bit DBI data corresponding to the kth burst data is referred to as a kth DBI bit. The DBI determination unit 410 may provide the 64-bit first data DATA1 and the 8-bit DBI data DBI to the first inverter 420.

The first inverter 420 may invert or non-invert the first data DATA1 according to the DBI data DBI to generate second data DATA2. The first inverter 420 may invert or non-invert first burst data of the first data DATA1 based on a first DBI bit, invert or non-invert second burst data of the first data DATA1 based on a second DBI bit, and invert or non-invert kth burst data of the first data DATA1 based on a kth DBI bit to generate second data DATA2 of 64 bits. The first inverter 420 may provide the 64-bit second data DATA2 and the 8-bit DBI data DBI to the CRC calculation unit 430.

The CRC calculation unit 430 may perform CRC calculation on the 64-bit second data DATA2 and the 8-bit DBI data DBI to generate CRC data CRC of 8 bits. The CRC calculation unit 430 may use CRC-8, i.e., $x8+x2+x+1$. The CRC calculation unit 430 may provide the 8-bit CRC data CRC to the output register 450. In some example embodiments, the CRC calculation unit 430 may provide the 8-bit CRC data CRC to an additional CRC register (not shown). The 8-bit CRC data CRC may be sequentially output in response to a burst clock signal through an EDC pin (not shown).

The second inverter 440 may receive the 8-bit DBI data DBI from the DBI determination unit 410, and may directly receive the 64-bit first data DATA1 through the 64 data lines. The second inverter 440 may invert or non-invert the first data DATA1 according to the DBI data DBI to generate third data DATA3. The second inverter 440 may invert or non-invert kth burst data of the first data DATA1 based on a kth DBI bit of the DBI data DBI. The second inverter 440 may provide the 64-bit third data DATA3 to the output register 450. The second inverter 440 may provide the 8-bit DBI data DBI to the output register 450.

The output register 450 may receive the 64-bit third data DATA3 from the second inverter 440. The output register 450 may receive the 8-bit CRC data CRC from the CRC calculation unit 430. The output register 450 may receive the 8-bit DBI data DBI from the DBI determination unit 410, the first inverter 420, the CRC calculation unit 430, or the second inverter 440. The output register 450 may provide the 64-bit third data DATA3, the 8-bit CRC data CRC, and the 8-bit DBI data DBI to the data output pins 460. The data output pins 460 may include 1st to 8th DQ pins DQ0-DQ7, and a DBI pin DBI. The 64-bit third data DATA3 and the 8-bit CRC data CRC may be output through the 1st to 8th DQ pins DQ0-DQ7 in response to a burst clock signal. One-bit CRC data CRC output through a kth DQ pin will be referred to as a kth CRC bit in the following description. The 8-bit DBI data DBI may be output through a DBI pin DBI in response to a burst clock signal.

FIG. 5 is a CRC data bit mapping table in a semiconductor memory device (X8) according to an example embodiment of the inventive concepts.

Referring to FIG. 5, a data bit output through each pin for each burst is shown. The semiconductor memory device using the CRC data bit mapping of FIG. 5 may be designed to output CRC data through DQ pins. 1st to 64th data bits d0-d63 are data output in response to one read command. The 1st to 64th data bits d0-d63 may be loaded on 64 data lines.

The 1st DQ pin DQ0 may sequentially output 1st to 8th data bits d0-d7 for the 1st to 8th bursts, respectively, output a first CRC bit CRC0 for a 9th burst, and output a desired logic high "1" for the 10th burst. The 2nd DQ pin DQ1 may sequentially output 9th to 16th data bits d8-d16 for the 1st to 8th bursts, respectively, output a second CRC bit CRC1 for the 9th burst, and output a desired logic high "2" for the 10th burst. Likewise, a kth DQ pin DQ(k-1) may sequentially output (8(k-1)+1)th to 8kth data bits d8(k-1)-d(8k-1) for the 1st to 8th bursts, respectively, output a kth CRC bit CRC(k-1) for the 9th burst, and output a desired logic high "1" for the 10th burst.

The DBI pin DBI may sequentially output the 1st to 8th DBI bits d64-d71 for the 1st to 8th bursts, respectively, and output a desired logic high "1" for the 9th and 10th bursts.

FIG. 6 is a CRC data bit mapping table in a semiconductor memory device (X16) according to an example embodiment of the inventive concepts.

Referring to FIG. 6, a data bit output through each pin for each burst is shown. The semiconductor memory device using the CRC data bit mapping of FIG. 5 may be designed to output CRC data through DQ pins. 1st to 128th data bits d0-d63 and d72-d135 are data output in response to one read command. The 1st to 128th data bits d0-d63 and d72-d135 may be loaded on 128 data lines.

The 1st to 64th data bits d0-d63, the 1st to 8th DBI bits d64-d71 corresponding to these data bits, and the 1st to 8th CRC bits CRC0-CRC7 calculated from the 1st to 64th data bits d0-d63 and the 1st to 8th DBI bits d64-d71 may be output through the 1st to 8th DQ pins DQ0-DQ7 and the first DBI pin LDBI.

Likewise, the 65th to 128th data bits d72-d135, the 9th to 16th DBI bits d136-d143 corresponding to these data bits, and the 9th to 16th CRC bits CRC8-CRC15 calculated from the 65th to 128th data bits d72-d135 and the 9th to 16th DBI bits d136-d143 may be output through the 9th to 16th DQ pins DQ8-DQ15 and the second DBI pin UDBI.

The DBI function and CRC function may be performed independently from each other on each of the 1st to 64th data bits d0-d63, and also on each of the 65th to 128th data bits d72-d135.

FIG. 7 is a CRC data bit mapping table in a semiconductor memory device (X8) according to an example embodiment of the inventive concepts.

Referring to FIG. 7, a data bit output through each pin for each burst is shown. The semiconductor memory device using the CRC data bit mapping of FIG. 7 may be designed to output CRC data through a separate EDC pin. 1st to 64th data bits d0-d63 are data output in response to one read command. The 1st to 64th data bits d0-d63 may be loaded on 64 data lines.

A first DQ pin DQ0 may sequentially output 1st to 8th data bits d0-d7 for the 1st to 8th bursts, respectively. A second DQ pin DQ1 may sequentially output 9th to 16th data bits d8-d15 for the 1st to 8th bursts, respectively. Likewise, a kth DQ pin DQ(k−1) may sequentially output (8(k−1)+1)th to 8kth data bits d8(k−1)-d(8k−1) for the 1st to 8th bursts, respectively.

A DBI pin DBI may sequentially output 1st to 8th DBI bits d64-d71 for the 1st to 8th bursts, respectively. An EDC pin EDC may sequentially output 1st to 8th CRC bits CRC0-CRC7 for the 1st to 8th bursts, respectively.

Although the example embodiment of FIG. 7 illustrates that the EDC pin EDC outputs the 1st to 8th DBI bits d64-d71 for the 1st to 8th bursts in synchronization with the 1st to 8th DQ pins DQ0-DQ7 and the DBI pin DBI, example embodiments of the inventive concepts are not limited thereto. Further to synchronization with the 1st to 8th DQ pins DQ0-DQ7 and the DBI pin DBI, the EDC pin EDC may output the 1st to 8th CRC bits CRC0-CRC7 with a delay of a desired time with respect to the 1st to 8th DQ pins DQ0-DQ7 and the DBI pin DBI.

Figure 8:
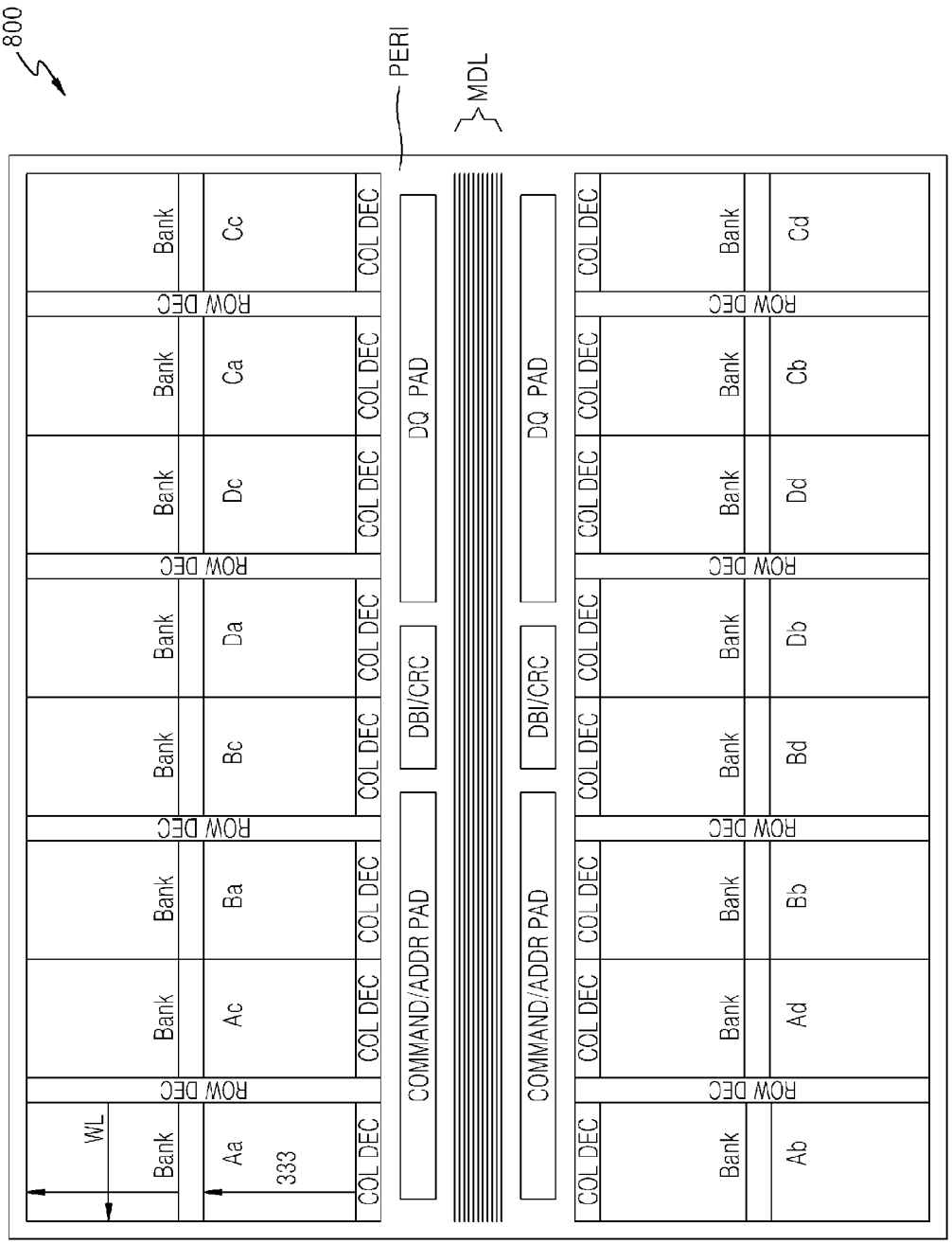
FIG. 8 is a schematic layout of a semiconductor memory device according to an example embodiment of the inventive concepts.

FIG. 8 is a schematic layout of a semiconductor memory device 800 according to an example embodiment of the inventive concepts.

Referring to FIG. 8, the semiconductor memory device 800 includes 1st to 16th memory banks Bank Aa-Ad, Ba-Bd, Da-Dd, and Ca-Cd. A main data line MDL, a command/address pad block COMMAND/ADDR PAD, a DBI/CRC block DBI/CRC, and a data pad block DQ PAD may be arranged in a peri region PERI in a center area of the semiconductor memory device 800. Row decoders ROW DEC and column decoders COL DEC may be arranged in a peripheral region of the 1st to 16th memory banks Bank Aa-Ad, Ba-Bd, Da-Dd, and Ca-Cd to access memory cells in the memory banks Bank Aa-Ad, Ba-Bd, Da-Dd, and Ca-Cd.

Input/output pins for inputting a command and an address may be arranged in the command/address pad blocks COMMAND/ADDR PAD. Input/output pins for inputting/outputting data may be arranged in the data pad block DQ PAD.

If the semiconductor memory device 800 includes n number of DQ pins and a burst length of m, (m×n) number of data bits may be read out in response to one read command. The main data line MDL may include (m×n) number of data lines, wherein m and n are natural numbers. For example, m and n may be 8. In this example embodiment, the main data line MDL may include 64 data lines.

Data of (m×n) bits may be read out from (m×n) number of memory cells in the memory banks Bank Aa-Ad, Ba-Bd, Da-Dd, and Ca-Cd in response to one read command, and the read (m×n) bit data may be loaded on an (m×n) number of data lines, respectively.

The DBI/CRC block DBI/CRC may receive the (m×n) bit data from the (m×n) data lines and generate DBi data of m bits and CRC data of n bits. The DBI/CRC block DBI/CRC may provide m-bit DBI data and n-bit CRC data to the data pad block DQ PAD.

In some example embodiments, the data pad block DQ PAD may include an inverter (not shown) that corresponds to the second inverter 140 of FIG. 1. The inverter may include n number of output inversion units that respectively correspond to n number of DQ pins, wherein each of the output inversion units may include m number of inverters. The m number of inverters included in each output inversion unit may invert or non-invert m-bit data based on m-bit DBI data, and the inverted or non-inverted m-bit data may be output through the corresponding DQ pins, respectively, in synchronization with a burst clock signal.

In an example embodiment of the inventive concepts, if the data pad block DQ PAD includes the inverter, the DBI/CRC blocks DBI/CRC may provide m-bit DBI data and n-bit CRC data to the data pad block DQ PAD. To this end, (m+n) number of data lines are required between the DBI/CRC blocks DBI/CRC and the data pad blocks DQ PAD.

However, if the data pad block DQ PAD does not include an inverter, and the (m×n) bit data inverted or non-inverted by the DBI/CRC blocks DBI/CRC is directly transferred from the DBI/CRC block DBI/CRC to the data pad block DQ PAD, (m×n) number of data lines are required between the DBI/CRC blocks DBI/CRC and the data pad block DQ PAD.

According to example embodiments of the inventive concepts, only (m+n) number of data lines, not the (m×n) number of data lines, may be used between the DBI/CRC block DBI/CRC and the data pad block DQ PAD, which may improve space use, and consequentially, reduce manufacturing costs.

Figure 9:
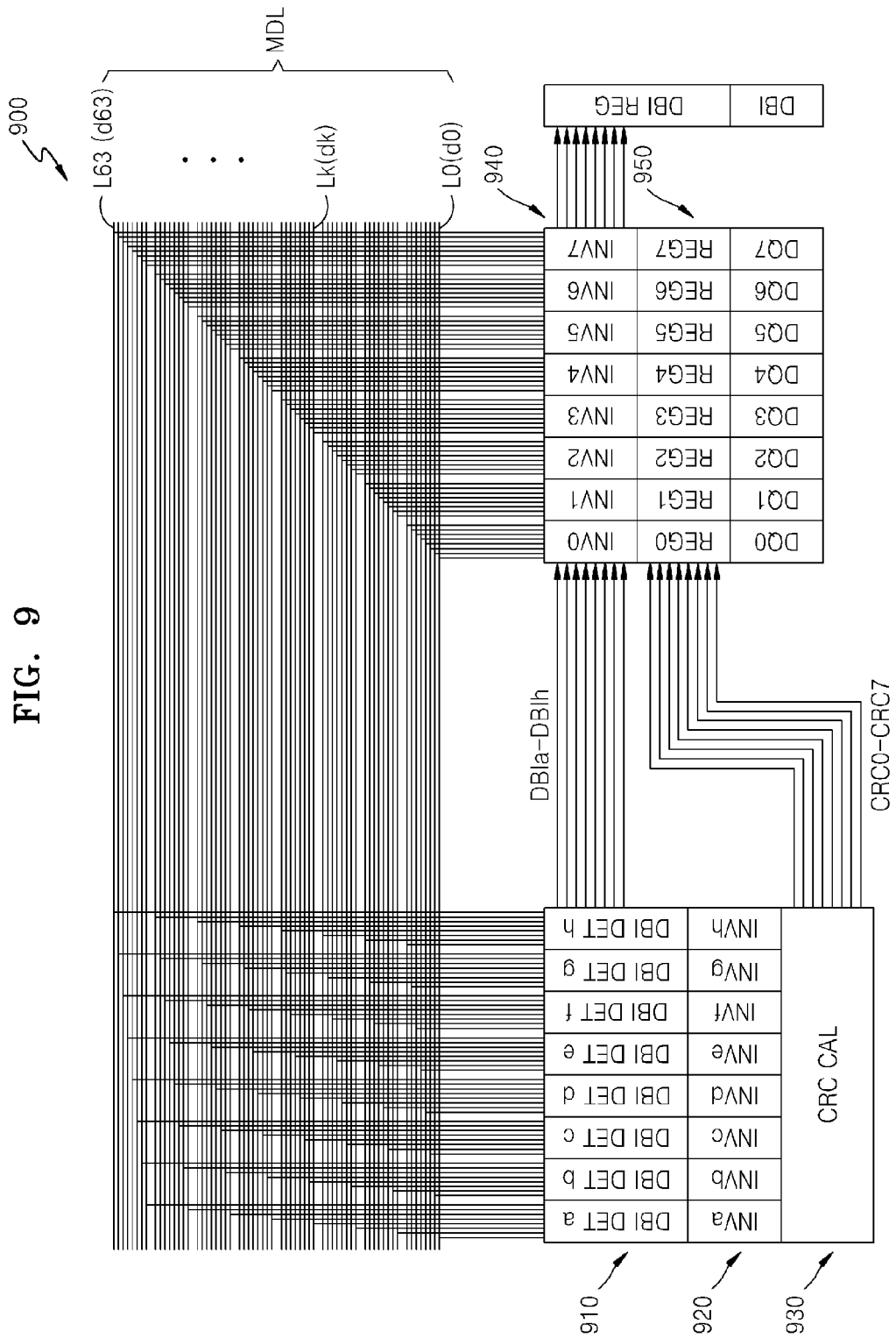
FIG. 9 is a schematic layout of a semiconductor memory device according to an example embodiment of the inventive concepts illustrating connection between blocks of the semiconductor memory device.

FIG. 9 is a schematic layout of a semiconductor memory device 900 according to an example embodiment of the inventive concepts illustrating connections between blocks of the semiconductor memory device 900.

Referring to FIG. 9, the semiconductor memory device 900 includes a main data line MDL including 1st to 64th data lines L0-L63. In the present example embodiment, it is assumed that the 1st to 64th data lines L0-L63 are loaded with 1st to 64th data bits d0-d63, respectively, and the semiconductor memory device 900 has eight DQ pins and a burst length of 8.

Referring to FIG. 9, the semiconductor memory device 900 includes a DBI determination unit 910, a CRC inverter 920, a CRC calculation unit 930, and an output inverter 940.

The DBI determination unit 910 includes 1st to 8th DBI determination units DBI DETa-DBI DETh, which each generate 1st to 8th DBI bits DBIa-DBIh, respectively. The CRC inverter 920 includes 1st to 8th CRC inversion units INVa-INVh. The CRC calculation unit 930 generates 1st to 8th CRC bits CRC0-CRC7.

The output inverter 940 includes 1st to 8th output inversion units INV0-INV7. The semiconductor memory device 900 includes an output register unit 950 including 1st to 8th output registers REG0-REG7, and a DBI register DBI REG. The semiconductor memory device 900 includes 1st to 8th DQ pins DQ0-DQ7, and a DBI pin DBI.

The 1st to 8th output inversion units INV0-INV7 may invert or non-invert corresponding data bits d0-d63 according to 1st to 8th DBI bits DBIa-DBIh, respectively. For example, a kth output inversion unit (INV(k−1)) may invert or non-invert data bits (d8(k−1)−d(8k−1)) to be output through a kth DQ pin (DQ(k−1) based on a kth DBI bit DBIk. The data bits (d8(k−1)−d(8k−1)) to be output through the kth DQ pin DQ(k−1) may be collectively referred to as a kth data column set.

The 1st to 8th DBI determination units DBI DETa-DBI DETh determine whether to perform DBI on data to be output at the same burst number through the 1st to 8th DQ pins DQ0-DQ7, respectively. For example a kth DBI determination unit DBI DETk determines whether to perform DBI on kth, (n+k)th, (2n+k)th, (3n+k)th, . . . , and ((m−1)n+k)th data bits. The kth, (n+k)th, (2n+k)th, (3n+k)th, . . . , and ((m−1) n+k)th data bits are data bits that are output at a kth burst through the 1st to 8th DQ pins DQ0-DQ7, respectively, and may be referred to as a kth data row set. The kth DBI determination unit DBI DETk generates a kth DBI bit DBIk.

The 1st to 8th CRC inversion units INVa-INVh may invert or non-invert corresponding data bits d0-d63 based on 1st to 8th DBI bits DBIa-DBIh, respectively. For example a kth CRC inversion unit INVk may invert or non-invert the data bits of the kth data row set, i.e., the kth, (n+k)th, (2n+k)th, (3n+k)th, . . . , and ((m−1)n+k)th data bits, according to a kth DBI bit.

The CRC calculation unit 930 performs CRC calculation on the data bits inverted or non-inverted by the 1st to 8th CRC inversion units INVa-INVh, and the 1st to 8th DBI bits DBIa-DBIh to generate CRC data of 8 bits, i.e., 1st to 8th CRC bits CRC0-CRC7.

The 1st to 8th output registers REG0-REG7 receive the data bits inverted or non-inverted by the 1st to 8th output inversion units INV0-INV7, and the 1st to 8th CRC bits CRC0-CRC7. For example a kth output register REG(k−1) receives the data bits inverted or non-inverted by the kth output inversion unit INV(k−1), i.e., the data bits of the kth data column set, and a kth CRC bit CRCk. The 1st to 8th output registers REG0-REG7 provide the data bits of the 1st to 8th data column sets and the 1st to 8th CRC bits CRC0-CRC7 to the 1st to 8th DQ pins DQ0-DQ7, respectively.

The 1st to 8th DQ pins DQ0-DQ7 output the data bits inverted or non-inverted by the 1st to 8th output inversion units INV0-INV7, and the 1st to 8th CRC bits CRC0-CRC7, respectively.

The 1st to 8th DBI bits DBIa-DBIh are temporarily stored in the DBI register DBI REG, and are output through the DBI pin DBI in synchronization with a burst clock signal.

Figure 10:
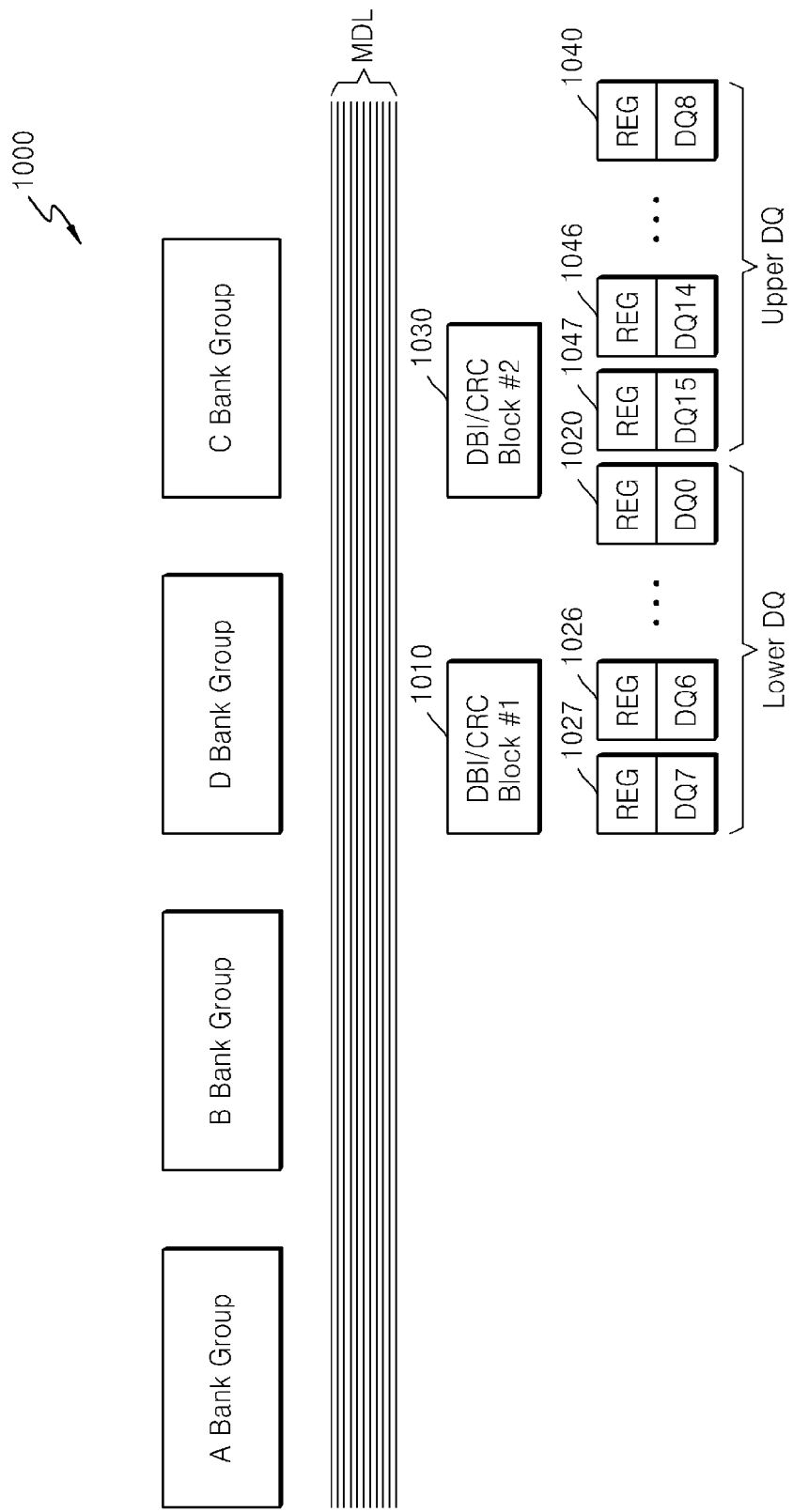
FIG. 10 is a schematic layout of a semiconductor memory device (X16) according to an example embodiment of the inventive concepts.

FIG. 10 is a schematic layout of a semiconductor memory device (X16) 1000 according to an example embodiment of the inventive concepts.

Referring to FIG. 10, the semiconductor memory device 1000 includes 1st to 4th bank groups (A bank group, B bank group, D bank group, and C bank group), and a main data line MDL.

A 1st DBI/CRC block 1010 is arranged adjacent to the main data line MDL. 1st to 8th register/DQ pin blocks 1020-1027 are arranged adjacent to the 1st DBI/CRC block 1010. The 1st DBI/CRC block 1010 and the 1st to 8th register/DQ pin blocks 1020-1027 perform the DBI function and CRC function on data output from lower X8 DQ pins of the X16 DQ pins.

A 2nd DBI/CRC block 1030 is arranged adjacent to the main data line MDL. 9th to 15th register/DQ pin blocks 1040-1047 are arranged adjacent to the 2nd DBI/CRC block 1030. The 2nd DBI/CRC block 1030 and the 9th to 15th register/DQ pin blocks 1040-1047 perform the DBI function and CRC function on data output from upper X8 DQ pins of the X16 DQ pins.

Figure 11:
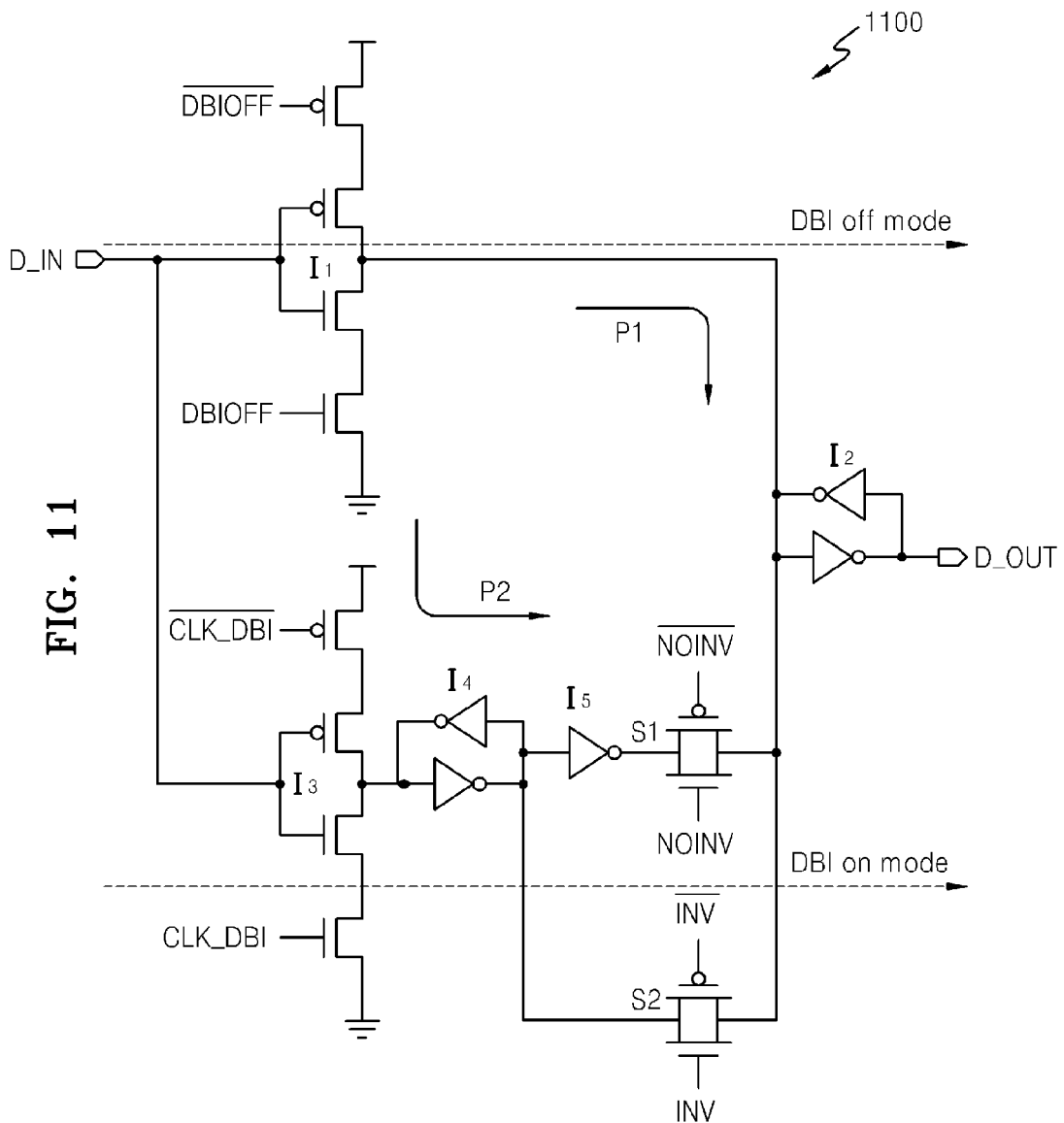
FIG. 11 is a circuit diagram of an inversion circuit of a semiconductor memory device, according to an example embodiment of the inventive concepts.

FIG. 11 is a circuit diagram of an inversion circuit 1100 of a semiconductor memory device, according to an example embodiment of the inventive concepts.

Referring to FIG. 11, the inversion circuit 1100 may be included in the 1st to 8th CRC inversion units INVa-INVh and the 1st to 8th output inversion units INV0-INV7 of FIG. 9. In the example embodiment of FIG. 9, the 1st to 8th CRC inversion units INVa-INVh and the 1st to 8th output inversion units INV0-INV7 may each includes the inversion unit 1100. The inversion circuit 1100 of FIG. 11 is an example, and example embodiments of the inventive concepts are not limited thereto.

The inversion circuit 1100 receives input data D_IN and outputs output data D_OUT. The input data D_IN may be an arbitrary one bit of the first data DATA1, and the output data D_OUT may be a corresponding one bit of the second data DATA2 or third data DATA3. The inversion circuit 1100 may operate in a DBI off mode or in a DBI on mode according to a MRS. In the DBI off mode, the inversion circuit 1100 may output data D_OUT that is the same as the input data D_IN. In the DBI on mode, the inversion circuit 1100 may output the output data D_OUT, which is inverted or non-inverted from the input data D_IN according to an invert signal INV or a non-invert signal NOINV. The invert signal INV and the non-invert signal NOINV may be signals that are inverse of each other.

In the DBI off mode, a DBI off signal DBIOFF (or DBIOFF/) is activated, and consequently a first inverter I1 is activated. The input data D_IN passes through the first inverter I1 and a second inverter I2 along a first path p1, and the output data D_OUT that is non-inverted from the input data D_IN is output.

In the DBI on mode, a DBI clock signal CLK_DBI (or CLK_DBI/) is activated, and consequently a third inverter I3 is activated. The input data D_IN passes along a second path P2.

A first switch S1 is shorted in response to the non-invert signal NOINV, and a second switch S2 is shorted in response to the invert signal INV. If the invert signal INV and the non-invert signal NOINV are complementary to each other, the first switch S1 and the second switch S2 may be complementarily either opened or shorted.

If the invert signal INV is activated and the non-invert signal NOINV is deactivated, the input data D_IN may pass through the third inverter I3, a fourth inverter I4, and the second inverter I2, and the output data D_OUT that is inverted from the input data D_IN may be output. If the invert signal INV is deactivated and the non-invert signal NOINV is activated, the input data D_IN may pass through the third inverter I3, the fourth inverter I4, a fifth inverter I5, and the second inverter I2, and the output data D_OUT that is inverted from the input data D_IN may be output.

FIG. 12 is a schematic block diagram of a semiconductor memory device 1200 according to another example embodiment of the inventive concepts.

Referring to FIG. 12, the semiconductor memory device 1200 may include a memory cell array 1201, a row decoder 1224 for driving rows of the memory cell array 1201, a column decoder 1210 for driving columns of the memory cell array 1201, and a sense amplifier 1230 for sensing and amplifying data. The semiconductor memory device 1200 may include various kinds of circuits, for example, a timing register 1202 for driving the memory cell array 1201, an address register 1220, a programming register 1204, a row address buffer 1222, and a column address buffer 1208.

The memory cell array 1201 may include memory cells for storing data. The memory cells may include a volatile memory cell such as those of a DRAM, a SRAM, and the like, and a non-volatile memory cell such as those of a MRAM, a PRAM, a Flash, a RRAM, an Anti-fuse Array cell, and the like.

The timing register 1202 may be activated if a chip select signal CSB shifts from an inactive level (for example, logic high) to an active level (for example, logic low). The timing register 1202 receives an external command signal, such as a clock signal CLK, a clock enable signal CKE, a chip select signal CSB, a row address strobe signal RASB, a column address strobe signal CASB, a write enable signal WEB, a data input/output mask signal DQM, and the like, and processes the received external command signal to generate internal command signals for controlling circuit blocks, such as LRAS, LCBR, LWE, LCAS, LWCBR, LDQM, and the like.

Some of the internal command signals generated by the timing register 1202 are stored in the programming register 1204. For example, latency information and burst length information associated with data output may be stored in the programming register 1204. The internal command signals stored in the programming register 1204 may be provided to a latency& burst length controller 1206. The latency& burst length controller 1206 may provide a control signal for controlling data output latency and burst length to the column decoder 1210 or an output buffer 1212 through the column address buffer 1208.

The address register 1220 may receive an external address signal ADD. A row address signal may be provided to the row decoder 1224 through the row address buffer 1222. A column address signal may be provided to the column decoder 1210 through the column address buffer 1208. The row address buffer 1222 may further receive a refresh address signal generated by a refresh counter, in response to a refresh command LRAS and LCBR, and provide one of the row address signal and the refresh address signal to the row decoder 1224. The address register 1220 may provide a bank signal for bank selection to a bank selection unit 1226.

The row decoder 1224 may decode a row address signal or a refresh address signal input from the row address buffer 1222, and may activate a word line of the memory cell array 1201. The column decoder 1210 may decode the column address signal and may perform an operation of selecting a bit line of the memory cell array 1201. In an example embodiment, a column selection line may be used in the semiconductor memory device 1200 for a selection operation via the selected column line.

The sense amplifier 1230 may amplify data of a memory cell selected by the row decoder 1224 and the column decoder 1210, and provide the amplified data to the output buffer 1212 through a main data line. Data to be written to a memory cell may be provided to the memory cell array 1201 through a data input register 1232, and an input/output controller 1234 may control an operation of data transfer through the data input register 1232.

The output buffer 1212 may include a DBI determination unit, a first inverter, a CRC calculation unit, and a second inverter as illustrated in FIGS. 1-4, and FIGS. 8-10. The DBI determination unit may receive first data stored in the memory cell array 1201 through the main data line, determine whether to perform DBI on the first data, and generate DBI data. The first inverter may invert or non-invert the first data according to the DBI data to generate second data. The CRC calculation unit may generate CRC data based on the second data and the DBI data. The second inverter may directly receive the first data through the main data line, and invert or non-invert the first data according to the DBI data to generate third data. The third data may be externally output through a DQ pin.

Figure 13A:
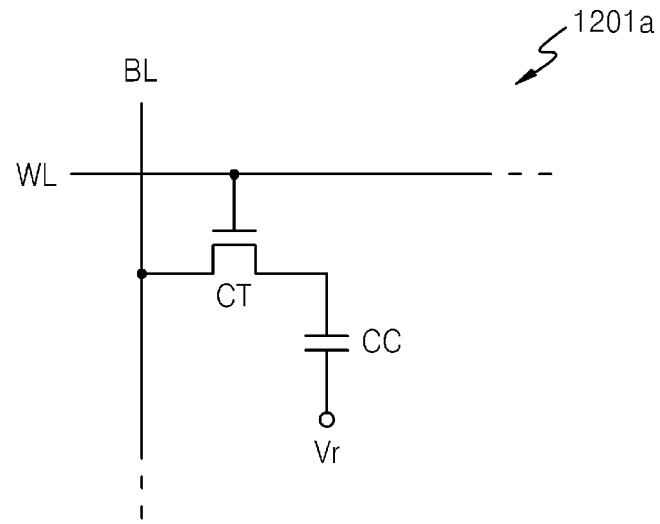
FIG. 13A is a circuit diagram of a DRAM cell implemented as a memory cell of a memory cell array of FIG. 12, according to an example embodiment of the inventive concepts.
Figure 13B:
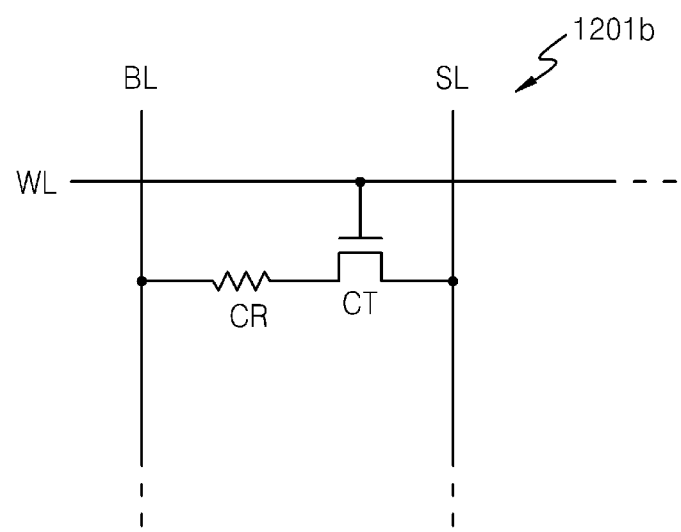
FIG. 13B is a circuit diagram of a MRAM cell implemented as a memory cell of the memory cell array of FIG. 12, according to another example embodiment of the inventive concepts.

FIGS. 13A and 13B are circuit diagrams of memory cells of the memory cell array 1201 of FIG. 12, according to some example embodiments of the inventive concepts.

FIG. 13A is a circuit diagram of a DRAM cell 1201a as a volatile memory cell of the memory cell array 1201 of FIG. 12, according to an example embodiment of the inventive concepts.

Referring to FIG. 13A, the DRAM cell 1201a may include a cell capacitor CC and a cell transistor CT. A gate of the cell transistor CT is connected to a word line (referred to also as a row line) WL, and a terminal thereof is connected to a bit line (referred to also as a column line) BL. The other terminal of the cell transistor CT is connected to a terminal of the cell capacitor CC. The other terminal of the cell capacitor CC is connected to a reference voltage Vr, for example, a ground voltage. If a turn-on voltage is applied to the gate of the cell transistor CT through the word line WL, the cell transistor CT is turned on. If a voltage is applied to the bit line BL, the cell capacitor CC is charged via the cell transistor CT. The cell capacitor CC may be determined to store 1 or 0 bit data based on whether charges are stored in the cell capacitor CC or not. Although a 1–T DRAM cell is illustrated in FIG. 13a as an example, example embodiments of the inventive concepts are not limited thereto, and may be applied to a DRAM cell with other circuit structures.

FIG. 13B is a circuit diagram of a MRAM cell 1201b as a non-volatile memory cell of the memory cell array 1201 of FIG. 12, according to another example embodiment of the inventive concepts.

Referring to FIG. 13B, the MRAM cell 1201b may include a cell resistor CR and a cell transistor CT. The cell resistor CR may be implemented as a magnetic tunnel junction (MTJ) device. A gate of the cell transistor CT is connected to a word line WL, and a terminal thereof is connected to a bit line BL via the cell resistor CR. The other terminal of the cell transistor CT is connected to a source line SL. To store data in a memory cell, a current direction flowing through the MTJ device may vary. For example, data may be stored in a memory cell by current flowing from the bit line BL toward the source line SL, or by current flowing from the source line SL toward the bit line BL.

Instead of the MTJ device, a resistive device such as a phase change random access memory (PRAM) using a phase-change material, a resistive random access memory (RRAM) using a variable resistance material, for example, a complex metal oxide, or a magnetic random access memory (MRAM) using a ferroelectric material may be used. Materials of these resistive devices may have a resistance that varies depending on a current or voltage level and/or direction in which the current or voltage flows, and may have non-volatile characteristics with a constant resistance level even if a supply of current or voltage is blocked.

Figure 13C:
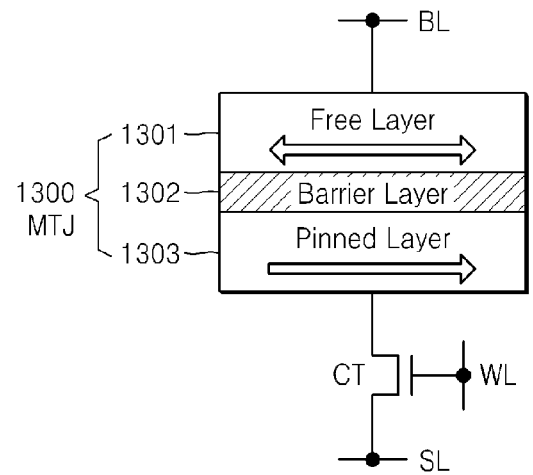
FIG. 13C is a diagram of a magnetic tunnel junction (MTJ) device implemented as a cell resistor of the MRAM cell of FIG. 13B, according to an example embodiment of the inventive concepts.

FIG. 13C is a diagram of a MTJ device 1300 as the cell resistor CR of the MRAM cell 1201b of FIG. 13B, according to an example embodiment of the inventive concepts.

Referring to FIG. 13C, the MTJ device 1300 may include a free layer 1301, a pinned layer 1303, and a barrier layer 1302 between the free layer 1301 and the pinned layer 1303. The pinned layer 1303 may have a fixed magnetization direction, while the free layer 1301 may have a magnetization direction that may be parallel or semi-parallel to the magnetization direction of the pinned layer 1303 depending on data written thereto. So that the pinned layer 1303 has a fixed magnetization direction, for example, an anti-ferromagnetic layer (not shown) may be further included.

For a write operation on a STT-MRAM cell, a logic high voltage is applied to the word line WL to turn on the cell transistor CT. A write current is applied to the bit line BL and the source line SL. A direction of the write current is determined depending on a logic state of data to be written to the MTJ device 1300.

For a read-out operation of the STT-MRAM cell, a logic high voltage is applied to the word line WL to turn on the cell transistor CT, and a read-out current is applied to the bit line BL and the source line SL. As a result, a voltage develops at opposite ends of the MTJ device 1300, and a logic state of the data written to the MTJ device 70 is determined through comparison with a desired reference voltage, so that the data stored in the MTJ device 1300 may be determined.

A resistance value of the MTJ device 1300 varies depending on the magnetization direction of the free layer 1301. If a read-out current flows through the MTJ device 1300, a data voltage of the MTJ device 1300 with respect to the resistance value is output. Since a magnitude of the read-out current is less than a magnitude of the write current, the magnetization direction of the free layer 1301 may not be changed by the read-out current.

If the magnetization direction of the free layer 1301 and the magnetization direction of the pinned layer 1303 are parallel in the MTJ device 1300, the MTJ device 1300 may have a low resistance value, and data "0" may be read out.

If the magnetization direction of the free layer 1301 and the magnetization direction of the pinned layer 1303 are semi-parallel in the MTJ device 1300, the MTJ device 1300 may have a high resistance value, and data "1" may be read out.

Although in the present example embodiment the magnetization directions of the free layer 1301 and the pinned layer 1303 are parallel, in some example embodiments the magnetization directions of the free layer 1301 and the pinned layer 1303 may be perpendicular.

Figure 14:
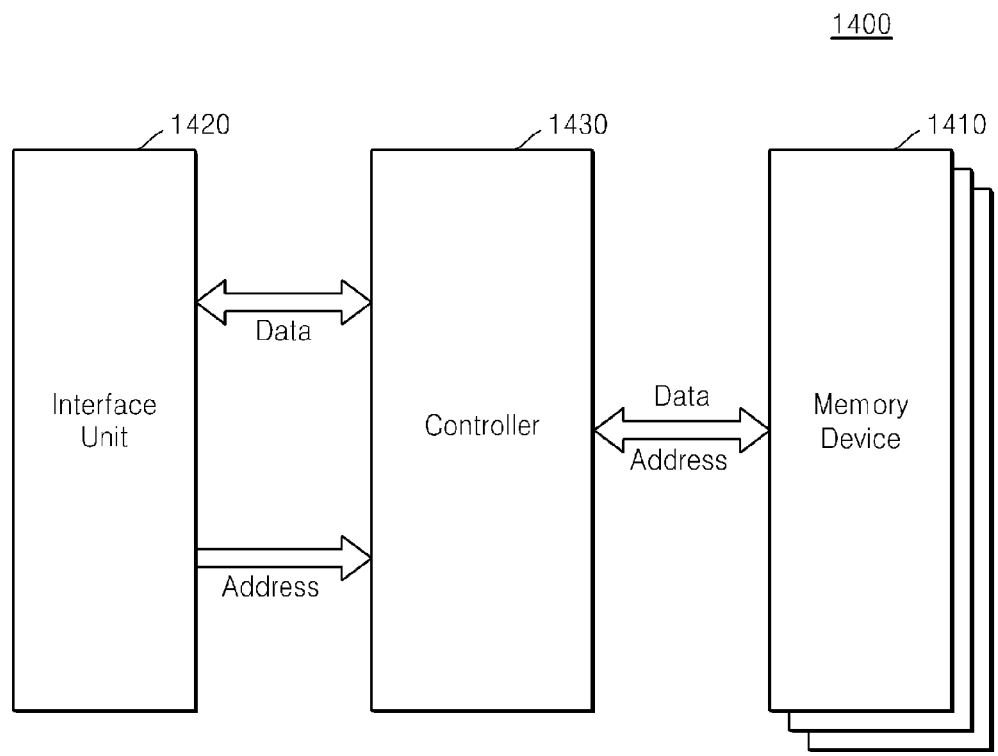
FIG. 14 is a block diagram of a memory system using a semiconductor memory device according to the one or more example embodiments of the inventive concepts.

FIG. 14 is a block diagram of a memory system 1400 using a semiconductor memory device according to the above-described example embodiments of the inventive concepts.

Referring to FIG. 14, the memory system 1400 may include a memory device 1410, an interface unit 1420, and a controller 1430.

The interface unit 1420 may interface with a host of the memory system 1400. The interface unit 1420 may include a data exchange protocol that is suitable for interfacing with the host. The interface unit 1420 may communicate with the host through one of any of a variety of interface protocols, for example, Universal Serial Bus (USB), Multi-Media Card (MMC), Peripheral Component Interconnect-Express (PCI-E), (Serial-attached Small Computer System Interface (SCSI) (SAS), Serial Advanced Technology Attachment (SAT), Parallel Advanced Technology Attachment (PATA), SCSI, Enhanced Small Disk Interface (ESDI), Integrated Drive Electronics (IDE), and the like.

The controller 1430 may be provided with external data and an external address through the interface unit 1420. The controller 1430 may access the semiconductor memory device 1410 with reference to the data and address provided from the host. The controller 1430 may transfer data DATA read out from the semiconductor memory device 1410 to the host via the interface unit 1420.

The semiconductor memory device 1410 may be any one of the semiconductor memory devices of FIGS. 1 to 4 and FIGS. 8 to 10 according to the one or more example embodiments of the inventive concepts. The semiconductor memory device 1410 may be a storage medium of the memory system 1400.

The memory system 1400 of FIG. 14 may be installed in an information processing apparatus, for example, in a personal digital assistant (PDA), a portable computer, a web tablet, a digital camera, a portable media player (PMP), a mobile phone, a wireless phone, or a laptop computer. The memory system 1400 may be implemented as a MMC card, a secure digital (SD) card, a micro SD card, a memory stick, an ID card, a personal computer memory card international association (PCMCIA) card, a chip card, a USB card, a smart card, a compact flash (CF) card, and the like.

Figure 15:
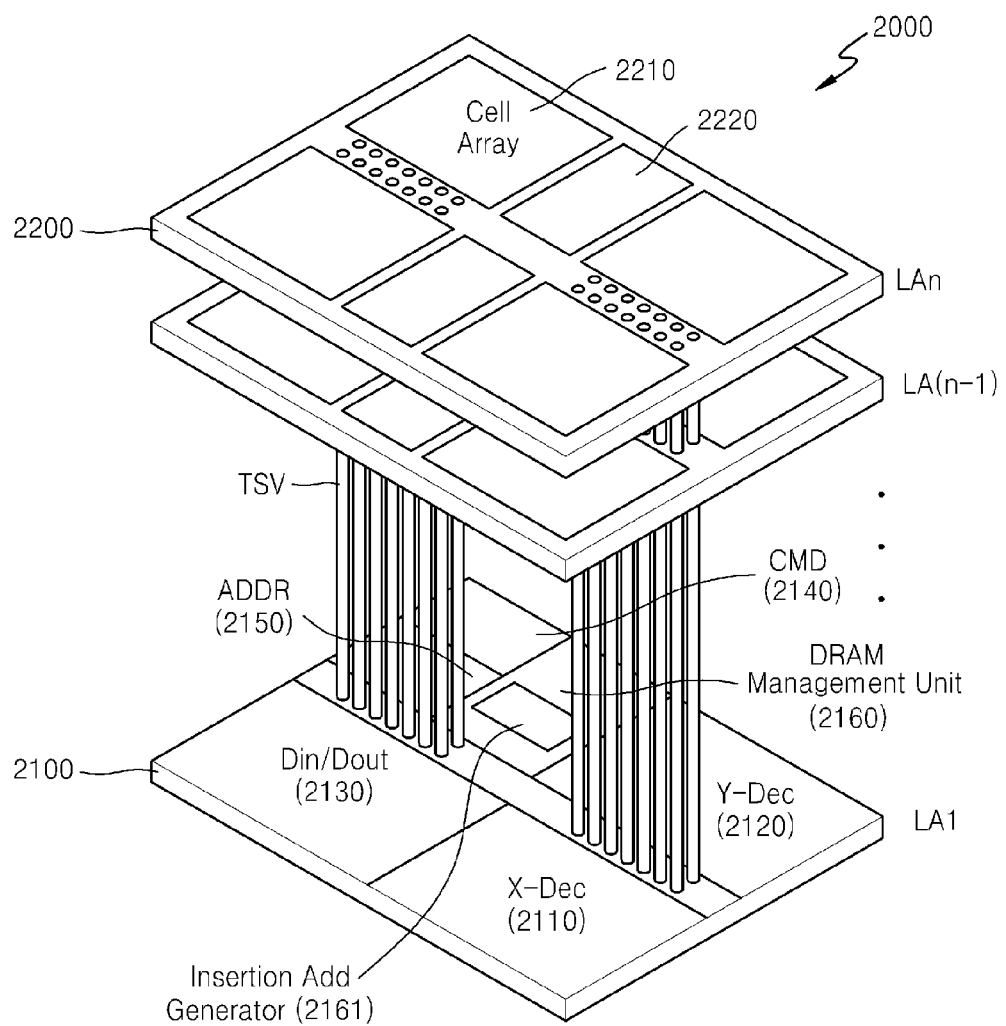
FIG. 15 is a diagram of a structure of a semiconductor memory device according to an example embodiment of the inventive concepts.

FIG. 15 is a diagram of a structure of a semiconductor memory device 2000 according to an example embodiment of the inventive concepts.

Referring to FIG. 15, the semiconductor memory device 2000 includes a plurality of semiconductor layers LA1-LAn. The semiconductor layers LA1-LAn may each be a memory chip including a volatile memory cell or a non-volatile memory cell. Some of the semiconductor layers LA1-LAn may be master chips interfacing with an external controller, and the rest of the semiconductor layers LA1-LAn may be slave chips storing data. In the example embodiment of FIG. 15, the lowermost semiconductor layer LA1 is assumed to be a master chip, the other semiconductor layers LA2-LAn are assumed to be slave chips, and the memory chips are assumed to include a DRAM cell.

The plurality of semiconductor layers LA1-LAn may mutually transmit and receive signals via through-silicon vias TSVs, and the master chip LA1 may communicate with an external memory controller (not shown) via a conducting unit (not shown) disposed on an external surface. A structure and operation of the semiconductor memory device 2000 are described focusing on a first semiconductor layer 2100 as a master chip and an nth semiconductor layer 2200 as a slave chip.

The first semiconductor layer 2100 may include various kinds of circuits for driving a memory cell array 2210 of the slave chips. For example, the first semiconductor layer 2100 may include a row decoder (X-Dec) 2110 for driving a word line of the cell array 2210, a column decoder (Y-Dec) 2120 for driving a bit line, a data input/output unit 2130 for controlling data input/output, a command buffer 2140 receiving an external command CMD, an address buffer 2150 for externally receiving an address and buffering the same, and a DRAM management unit 2160 for managing the memory operation of the slave chip.

The data input/output unit 2130 may include the DBI determination unit, the first inverter, the CRC calculation unit, and the second inverter of FIGS. 1-4, and FIGS. 8-10. The DBI determination unit may receive first data stored in the memory cell array through the main data line, determine whether to perform DBI on the first data, and generate DBI data. The first inverter may invert or non-invert the first data based on the DBI data to generate second data. The CRC calculation unit may generate CRC data based on the second data and the DBI data. The second inverter may directly receive the first data through the main data line, and invert or non-invert the first data according to the DBI data to generate third data. The third data may be output to an external memory controller through the conducting unit.

The nth semiconductor layer 2200 may include a cell array 2210, and a peripheral circuit region 2220 in which other peripheral circuits for driving the cell array 2210, for example, a row/column selection unit for selecting a row and a column, a bit line sense amplifier (not shown), and the like, may be disposed.

Figure 16:
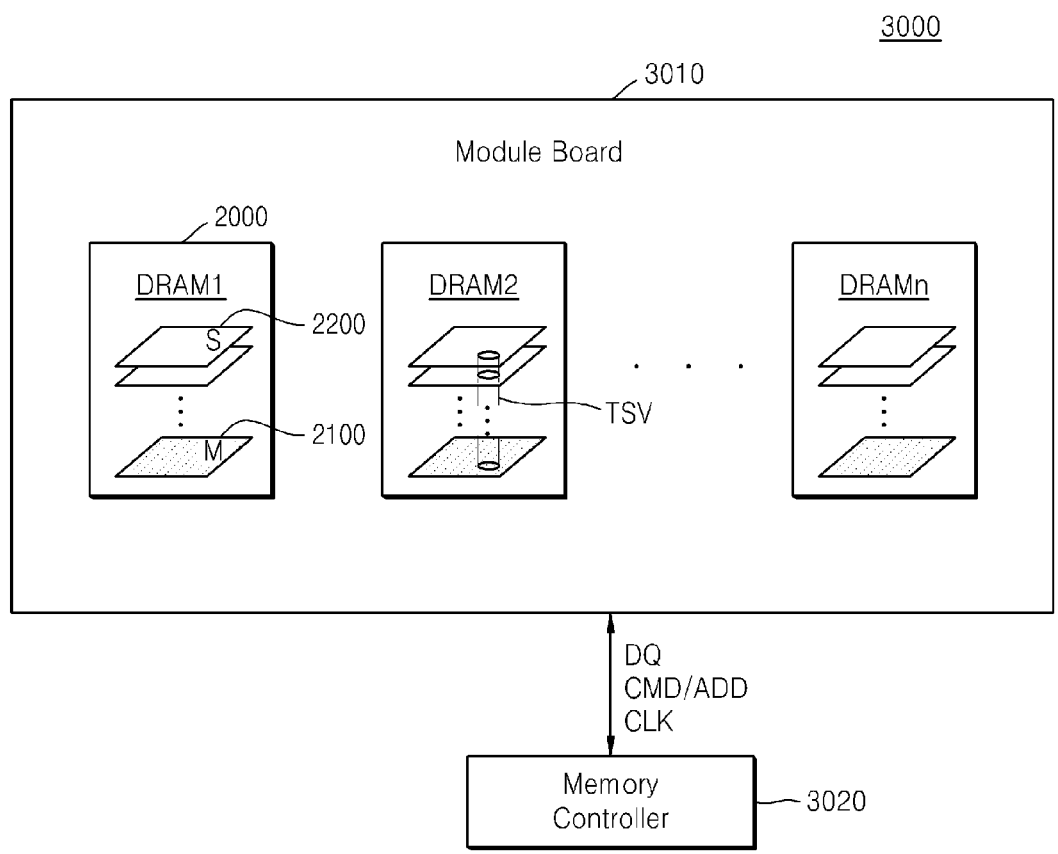
FIG. 16 is a block diagram of a memory system using a semiconductor memory device according to the one or more example embodiments of the inventive concepts.

FIG. 16 is a block diagram of a memory system 3000 using a semiconductor memory device according to the above-described example embodiments of the inventive concepts.

Referring to FIG. 16, the memory system 3000 may include a memory module 3010 and a memory controller 3020. The memory module 3010 may include at least one semiconductor memory device 2000 mounted on a module board. The semiconductor memory device 2000 may be implemented as a DRAM chip. This is only an example, and the present example embodiments are not limited thereto. In some example embodiments, the semiconductor memory device 2000 may be implemented as a MRAM chip, a RRAM chip, a PRAM chip, an Anti-fuse array chip, a Flash memory chip, and the like. The semiconductor memory devices 2000 may each include a plurality of semiconductor layers. The plurality of semiconductor layers may each include at least one master chip 2100 and at least one slave chip 2200. The semiconductor layers may mutually transmit signals via through-silicon vias TSVs.

Although in the present example embodiment a structure of the semiconductor layers between which signal transmission is performed via the through-silicon vias TSVs, example embodiments of the inventive concepts are not limited thereto. A stack structure of the semiconductor layers using wire bonding, an interposer, or a tape with wires may be used.

In another example embodiment, the signal transmission between the semiconductor layers may be achieved using an optical input/output connection (Optical 10 Connection). For example, the semiconductor layers may mutually transmit signals by radiation using radio-frequency waves or ultrasonic waves, inductive coupling using magnetic induction, or non-radiation using magnetic field resonance.

The radiation method uses an antenna such as a monopole antenna or a planar inverted-F antenna (PIFA) to wirelessly transmit signals. Radiation takes place while an electric or magnetic field varying with time influences each other. If an antenna using the same frequency band as incident waves is used, a signal may be received according to polarization characteristics of the incident waves. The inductive coupling method generates a strong magnetic field in one direction using a multiple wire wound coil and induces coupling by placing a coil resonating at a similar frequency to that of the magnetic field. The non-radiation method uses evanescent-wave coupling by which electromagnetic waves are transmitted from one medium to another, wherein the two media resonate at the same frequency through a near-field electromagnetic field.

The memory module 3010 may communicate with the memory controller 3020 via a system bus. Data DQ, a command/address CMD/ADD, and a clock signal CLK, and the like may be transmitted and received between the memory module 3010 and the memory controller 3020 via the system bus.

Figure 17:
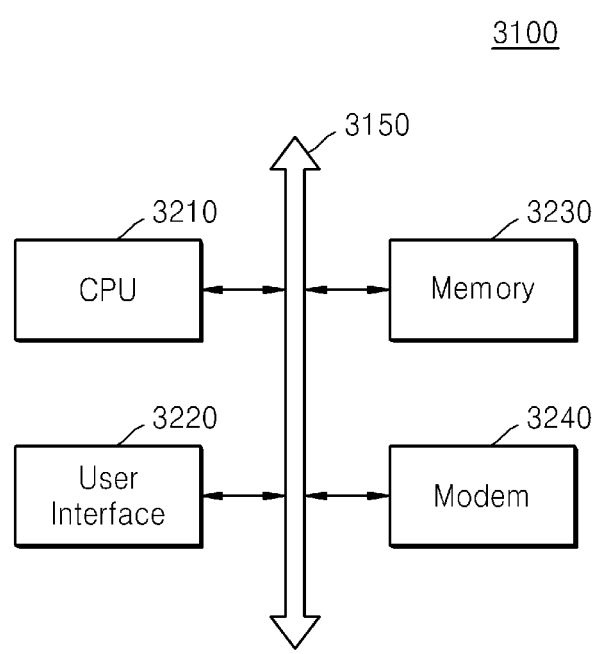
FIG. 17 is a diagram of a computer system including a semiconductor memory device according to the one or more example embodiments of the inventive concepts.

FIG. 17 is a diagram of a computer system 3100 including a semiconductor memory device according to the above-described example embodiments of the inventive concepts.

Referring to FIG. 17, the computer system 3100 may include a central processing unit (CPU) 3210 that is electrically connected to a system bus 3150, a user interface 3220, a memory 3230, and a modem 3240, such as a baseband chipset. The user interface 3220 may be an interface for transmitting data to or receiving data from a communication network. The user interface 3220 may be a wired or wireless form, and in some example embodiments, may include an antenna, a wired/wireless transceiver, or the like. Data provided via the user interface 3220 or the modem 3240, or processed by the CPU 3210 may be stored in the memory 3230.

The memory 3230 may include a volatile memory device such as a DRAM, and/or a non-volatile memory device such as a flash memory. The memory 3230 may be implemented using a DRAM, a PRAM, a MRAM, a ReRAM, a FRAM, a NOR flash memory, a NAND flash memory, a fusion flash memory (for example, a memory including a SRAM buffer, a NAND flash memory, and a NOR interface logic), and the like. The memory 3230 may be implemented as a semiconductor memory device or a memory system according to the above-described example embodiments of the inventive concepts.

If the computer system 3100 is a mobile device, a battery for supplying an operating voltage of the computer system 3100 may be provided. Although not illustrated, the computer system 3100 may further include an application chipset, a camera image processor (CIP), and an input/output unit.

If the computer system 3100 is a wireless communication device, the computer system 3100 may be used in a communication system such as Code Division Multiple Access (CDMA), Global System for Mobile communication (GSM), North American Digital Cellular (NADC), and CDMA2000.

Figure 18:
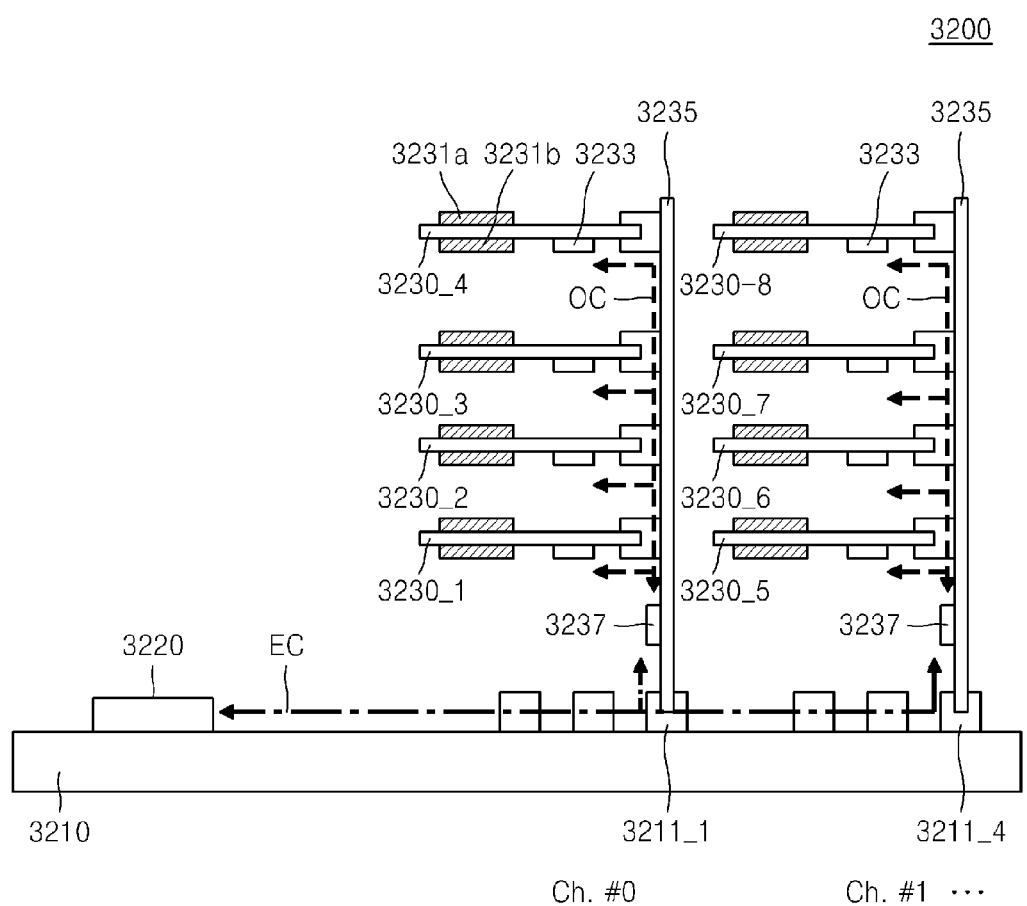
FIG. 18 is a diagram of a structure of a server system including a semiconductor memory device according to the one or more example embodiments of the inventive concepts.

FIG. 18 is a diagram of a structure of a server system 3200 including a semiconductor memory device according to the above-described example embodiments of the inventive concepts.

Referring to FIG. 18, the server system 3200 includes a memory controller 3220 and a plurality of memory modules 3230_1-3230_8. The memory modules 3230_1-3230_8 may each include memory blocks 3231a and 3231b each including a plurality of memory chips. For example, the memory chips of the memory blocks 3231a and 3231b may include volatile or non-volatile memory chips. For example, the memory chips may include a DRAM, a SRAM, a MARAM, a RRAM, a PRAM, an Anti-fuse array chip, a Flash memory chip, and the like. The memory chips may be any one of the semiconductor memory devices of FIGS. 1-4 and FIGS. 8-10 according to the above-described example embodiments of the inventive concepts.

Referring to FIG. 18, the server system 3200 may have a structure in which second circuit boards 3235 are connected to sockets 3211_1-3211_m of a first circuit board 3210, respectively. For example, the server system 3200 may be designed to have a channel structure in which one second circuit board 3235 and the first circuit board 3210 are connected to form each signal channel. However, example embodiments of the inventive concepts are not limited thereto, and the server system 3200 may have any of a variety of structures.

Signal transmission between the memory modules 3230_1-3230_8 may be achieved using optical input/output connection. To achieve the optical I/O connection, the server system 3200 may further include an electro-photo conversion unit 3237, and the memory modules 3230_1-3230_8 may each further include a photo-electric conversion unit 3233.

The memory controller 3220 may be connected to the electro-photo conversion unit 3237 via an electric channel EC. Consequently, the memory controller 3220 may transmit signals to and receive signals from the electro-photo conversion unit 3237 via the electric channel EC.

The electro-photo conversion unit 3237 may convert an electric signal received from the memory controller 3220 through the electric channel EC into an optical signal and transmit the optical signal through an optical channel OC. The electric-photo conversion unit 3237 may convert the optical signal received via the optical channel OC into an electric signal and transmit the same through the electric channel EC.

The memory modules 3230_1-3230_8 are connected to the electro-photo conversion unit 3237 via the optical channel OC. The optical signals transmitted to the memory modules 3230_1-3230_8 may be converted into electric signals by the photo-electric conversion units 3233, and then transmitted to the memory blocks 3231a and 3231b. The server system 3200, including the optically connected memory modules, may have improved storage capacity and processing speed.

While example embodiments of the inventive concepts have been particularly shown and described with reference to some example embodiments, it will be understood that various changes in form and details may be made therein without departing from the spirit and scope of the following claims.

What is claimed is:

1. A semiconductor memory device comprising:
   a data bus inversion (DBI) determination unit configured to determine whether to perform DBI based on first data on a main data line and configured to generate DBI data;
   a first inverter configured to invert or non-invert the first data according to the DBI data to generate second data;
   a cyclic redundancy check (CRC) calculation unit configured to generate CRC data based on the second data and the DBI data;
   a second inverter configured to invert or non-invert the first data according to the DBI data to generate third data; and
   a DQ pin, wherein the semiconductor memory device is configured to output the third data externally via the DQ pin.

2. The semiconductor memory device of claim 1, wherein the second inverter is configured to directly receive the first data from the main data line.

3. The semiconductor memory device of claim 1, wherein the semiconductor memory device is configured to output the CRC data after the third data via the DQ pin.

4. The semiconductor memory device of claim 1, further comprising:
   an output register configured to receive the third data from the second inversion unit and the CRC data from the CRC calculation unit, and configured to sequentially provide the third data and the CRC data to the DQ pin.

5. The semiconductor memory device of claim 1, further comprising:
   an error detection code (EDC) pin configured to output the CRC data externally.

6. The semiconductor memory device of claim 1, further comprising:
   a DBI pin, wherein the semiconductor memory device is configured to output the DBI data externally via the DBI pin.

7. The semiconductor memory device of claim 1, wherein the first inverter is adjacent to the CRC calculation unit, and the second inverter is adjacent to the DQ pin.

8. The semiconductor memory device of claim 1, wherein the first inverter and the CRC calculation unit are deactivated if a CRC function is turned off, and
the first inversion unit and the second inversion unit invert the first data if a DBI function is turned off.

9. A semiconductor memory device with n number of DQ pins and a burst length of m, wherein m and n are natural numbers, comprising:
   a main data line configured to transmit first data including $1^{st}$ to $(m \times n)^{th}$ data bits, the $1^{st}$ to $(m \times n)^{th}$ data bits including $1^{st}$ to $m^{th}$ data column sets or $1^{st}$ to $n^{th}$ data row sets, each data column set being of n data bits, and each data row set being of m data bits;
   a data bus inversion (DBI) determination unit configured to determine whether to perform DBI on each of the $1^{st}$ to $m^{th}$ data column sets to generate $1^{st}$ to $m^{th}$ DBI bits;
   a cyclic redundancy check (CRC) inverter configured to invert or non-invert the $1^{st}$ to $m^{th}$ data column sets based on the $1^{st}$ to $m^{th}$ DBI bits to generate second data;
   a CRC calculation unit configured to generate $1^{st}$ to $n^{th}$ CRC bits from the second data and the $1^{st}$ to $m^{th}$ DBI bits;
   an output inverter configured to invert or non-invert m data bits in each of the $1^{st}$ to $n^{th}$ data row sets of $1^{st}$ to $(m \times n)^{th}$ data bits based on the $1^{st}$ to $m^{th}$ DBI bits to generate third data; and
   $1^{st}$ to $n^{th}$ registers configured to provide the third data corresponding to the $1^{st}$ to $n^{th}$ data row sets and the $1^{st}$ to $n^{th}$ CRC bits to $1^{st}$ to $n^{th}$ DQ pins, respectively.

10. The semiconductor memory device of claim 9, wherein the DBI determination unit includes $1^{st}$ to $m^{th}$ DBI determination units, and
    a $k^{th}$ DBI determination unit (where $1 \leq k \leq m$) is configured to determine whether to perform DBI on n number of data bits of a $k^{th}$ data column set.

11. The semiconductor memory device of claim 9, wherein the CRC inverter includes $1^{st}$ to $m^{th}$ CRC inverter units, and
    a $k^{th}$ CRC inverter unit (where $1 \leq k \leq m$) is configured to invert or non-invert n number of data bits of a $k^{th}$ data column set to generate some of the second data that corresponds to the $k^{th}$ data column set.

12. The semiconductor memory device of claim 9, wherein the output inverter includes $1^{st}$ to $n^{th}$ output inverter units, and
    a $k^{th}$ output inverter unit (where $1 \leq k \leq n$) is configured to invert or non-invert m number of data bits of a $k^{th}$ data row set based on the corresponding $1^{st}$ to $m^{th}$ DBI bits to generate some of the third data that corresponds to the $k^{th}$ data row set.

13. The semiconductor memory device of claim 9, wherein the $k^{th}$ data column set (where $1 \leq k \leq m$) among the $1^{st}$ to $m^{th}$ data column sets includes $k^{th}$, $(n+k)^{th}$, $(2n+k)^{th}$, $(3n+k)^{th}$, ..., and $((m-1)n+k)^{th}$ data bits.

14. The semiconductor memory device of claim 9, wherein the $k^{th}$ data row set (where $1 \leq k \leq n$) among the $1^{th}$ to $n^{th}$ data row sets includes $((k-1)n+1)^{th}$, $((k-1)n+2)^{th}$, $((k-1)n+3)^{th}$, $((k-1)n+4)^{th}$, ..., and $(k \times n)^{th}$ data bits.

15. The semiconductor memory device of claim 9, wherein a $k^{th}$ register (where $1 \leq k \leq n$) is configured to sequentially provide $((k-1)n+1)^{th}$, $((k-1)n+2)^{th}$, $((k-1)n+3)^{th}$, $((k-1)n+4)^{th}$, ..., and $(k \times n)^{th}$ data bits of the third data, and the $k^{th}$ CRC bit to a $k^{th}$ DQ pin.

16. A semiconductor memory device comprising:
    a main data line;
    a first circuit configured to invert or non-invert first data received from the main data line according to a ratio of logic low data to logic high data in order to generate second data, and configured to generate cyclic redundancy check (CRC) data based on the second data and the ratio of logic low data to logic high data; and a second circuit electrically connected in parallel with the first circuit to the main data line, the second circuit configured to invert or non-invert the first data received from the main data line based on the ratio of logic low data to logic high data in order to generate third data.

17. The semiconductor memory device of claim 16, wherein the first circuit includes a data bus inversion (DBI) determination unit configured to determine the ratio of logic low data to logic high data, and the second circuit receives an indication of the ratio of logic low data to logic high data from the DBI determination unit.

18. The semiconductor memory device of claim 17, wherein the DBI determination unit is configured to determine whether to perform DBI based on the ratio of logic low data to logic high data.

19. The semiconductor memory device of claim 16, wherein the semiconductor memory device is configured to output the third data externally via a DQ pin.

20. The semiconductor memory device of claim 19, further comprising:

an output register configured to receive the third data from the second circuit and the CRC data from the first circuit, and configured to sequentially provide the third data and the CRC data to the DQ pin.

* * * * *